United States Patent
Arai et al.

(10) Patent No.: US 6,875,639 B2
(45) Date of Patent: Apr. 5, 2005

(54) SEMICONDUCTOR DEVICE AND METHOD OF MANUFACTURING THE SAME

(75) Inventors: Hiroshi Arai, Yamato (JP); Nobuaki Nagashima, Yamato (JP); Norihiko Kasai, Sagamihara (JP); Isao Seki, Ebina (JP)

(73) Assignees: Renesas Technology Corp., Tokyo (JP); Hitachi Hokkai Semiconductor, Ltd., Hokkaido (JP)

( * ) Notice: Subject to any disclaimer, the term of this patent is extended or adjusted under 35 U.S.C. 154(b) by 266 days.

(21) Appl. No.: 10/091,426

(22) Filed: Mar. 7, 2002

(65) Prior Publication Data

US 2002/0135056 A1 Sep. 26, 2002

(30) Foreign Application Priority Data

Mar. 22, 2001 (JP) ......................................... 2001-083180

(51) Int. Cl.[7] .......................... H01L 21/44; H01L 21/48; H01L 21/50

(52) U.S. Cl. ......................................... 438/126; 438/127
(58) Field of Search ................................... 438/126, 127

(56) References Cited

FOREIGN PATENT DOCUMENTS

| JP | 10-135258 | 5/1998 |
|----|-----------|--------|
| JP | 11-354558 | 12/1999 |

*Primary Examiner*—David A. Zarneke
(74) *Attorney, Agent, or Firm*—Mattingly, Stanger, Malur & Brundidge, P.C.

(57) ABSTRACT

A semiconductor chip has a quadrangle main surface, a wiring substrate, and a resin seal member for sealing the semiconductor chip, in which the resin seal member has a quadrangle main surface which confronts the main surface of the semiconductor chip. A gate cut trace portion is formed on a side face extending along a first side of the main surface of the resin seal member. A sectional area of an area between the main surface of the wiring substrate and the main surface of the resin seal member at a position outside a side face of the semiconductor chip is smaller than a sectional area of an area between the main surface of the semiconductor chip and the main surface of the resin seal member.

3 Claims, 32 Drawing Sheets

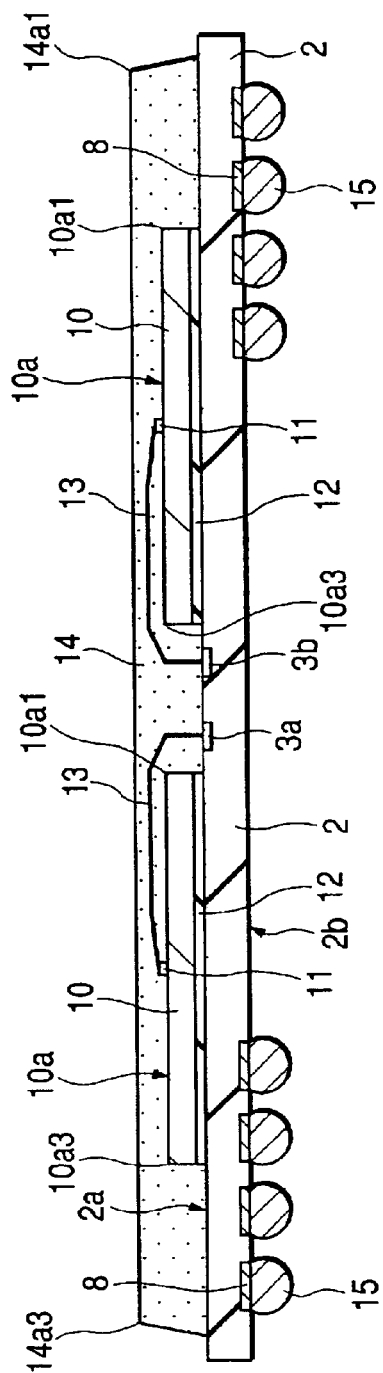
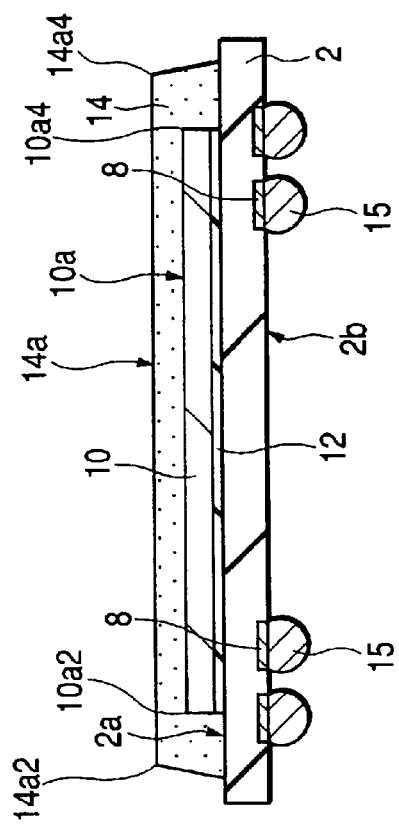

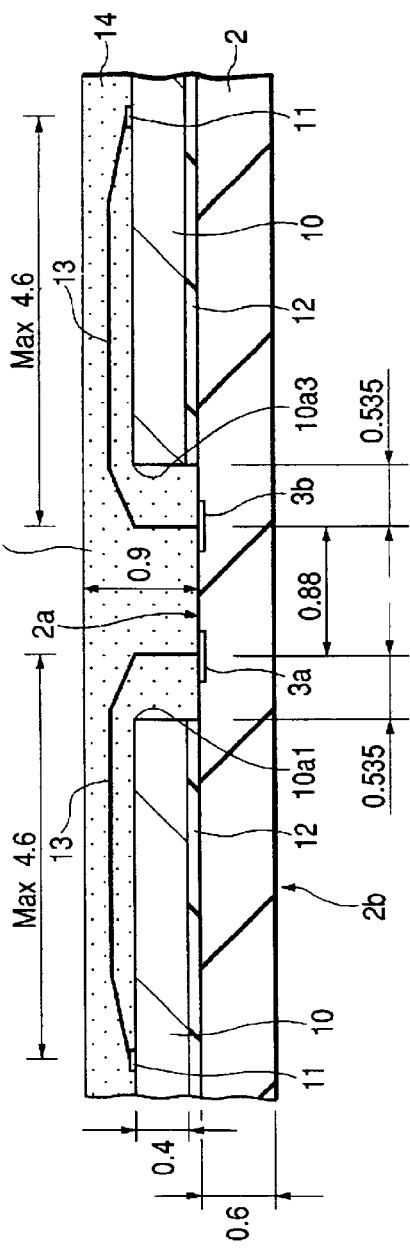
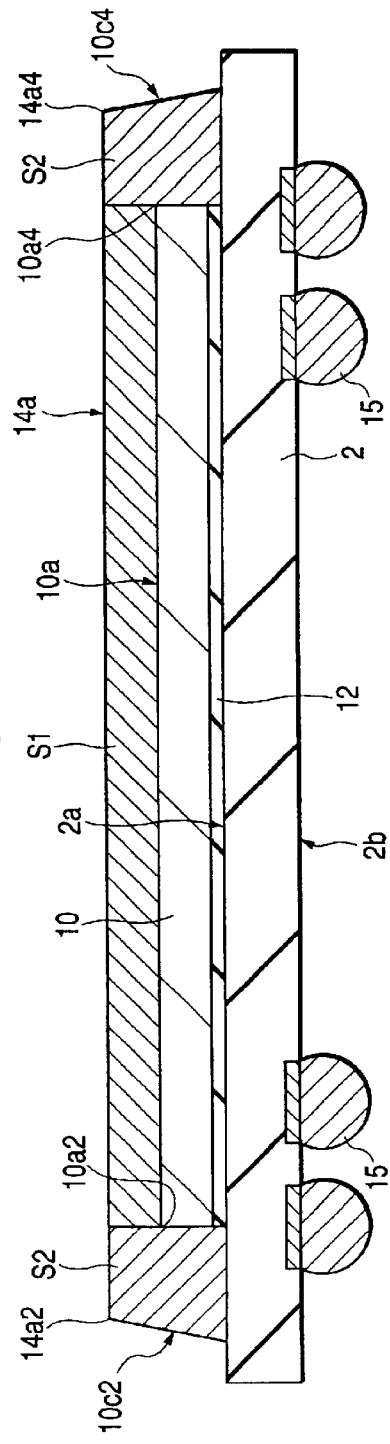

SEMICONDUCTOR DEVICE AND METHOD OF MANUFACTURING THE SAME

BACKGROUND OF THE INVENTION

The present invention relates to a semiconductor device and a manufacturing technique for the same. Particularly, the present invention is concerned with a technique effective in its application to a semiconductor device having a package structure wherein a semiconductor chip disposed on a substrate is sealed with a resin seal member.

As to semiconductor devices built into small-sized electronic devices such as portable telephones, portable information processing terminal devices and personal computers, there exists a demand for the reduction of thickness and size and an increase in the number of pins. As a semiconductor device suitable for satisfying such a demand there is known, for example, a semiconductor device called BGA (Ball Grid Array) type. As to the BGA type, various structures have been proposed and manufactured as products. Among them, BGA type of a face-up structure is most popular which permits the use of existing manufacturing equipment and which can be manufactured at low cost.

A BGA type semiconductor device of a face-up structure mainly comprises a wiring substrate, a semiconductor chip disposed on one main surface of the wiring substrate, plural bonding wires for bonding between plural connections formed on a main surface of the semiconductor chip and plural connections formed on the main surface of the wiring substrate, a resin seal member for sealing the semiconductor chip and the plural bonding wires, and plural ball bumps serving as terminals for external connection and disposed on another main surface (back side) opposite to the one main surface of the wiring substrate.

In the manufacture of a BGA type semiconductor device having a face-up structure there is used, for the improvement of productivity, a multiple wiring substrate having plural substrate forming areas (product forming areas) which are arranged in one direction continuously at predetermined intervals. A resin seal member forming area is provided in each substrate forming area of the multiple wiring substrate and a chip mounting area is provided in each resin seal member forming area. Each substrate forming area is surrounded with a separating area. By cutting the separating area with a cutting tool to cut out the associated substrate forming area there is formed a wiring substrate. The operation for cutting out each substrate forming area is performed, for example, after successive execution of chip mounting, wire bonding, resin seal member forming and bump forming steps.

For forming a resin seal member for sealing a semiconductor chip there is adopted a transfer molding method which is suitable for mass production. The formation of a resin seal member by the transfer molding method is carried out using a molding die constituted mainly by upper and lower molds and with plural cavities formed in the upper mold correspondingly to substrate forming areas of a multiple wiring substrate. According to the transfer molding method, a multiple wiring substrate which has gone through a chip mounting step and a wire bonding step is positioned between the upper and lower molds of the molding die and resin is poured from pots into the cavities through culls, runners and resin pouring gates. Each cavity is mainly composed of a quadrangular main surface opposed to a main surface of a semiconductor chip and four side faces extending along the four sides, respectively, of the quadrangular main surface. The cavities are disposed on the resin seal member forming areas of the multiple wiring substrate so as to cover semiconductor chips. As the resin there is used a thermosetting epoxy resin for example.

As to the manufacture of a BGA type semiconductor device using a carrier substrate, it is described, for example, in Japanese Published Unexamined Patent Application No. Hei 10(1998)-135258.

SUMMARY OF THE INVENTION

Also for BGA type semiconductor devices, the reduction of cost is required. For the reduction of cost it is effective to enhance the utilization factor of a multiple wiring substrate for products. To this end it is necessary that the spacing between adjacent resin seal member forming areas on a multiple wiring substrate be made as narrow as possible.

The spacing between adjacent resin seal member forming areas on a multiple wiring substrate differs between the case of using a molding die of a corner gate structure with a resin pouring gate provided at a corner portion at which two side faces of a cavity cross each other and the case of using a molding die of a center gate structure with a resin pouring gate provided centrally of one side face of a cavity.

In the corner gate structure it is necessary to widen the spacing between adjacent cavities lest a runner extended to a corner portion of a cavity should contact the other cavity. Consequently, the spacing between adjacent resin seal member forming areas on the multiple wiring substrate becomes wide. On the other hand, in the center gate structure, even if the spacing between adjacent cavities is made narrow, a runner extended to a central part of one side face of a cavity does not contact the other cavity, so that it is possible to narrow the cavity-to-cavity spacing and thereby narrow the spacing between adjacent resin seal member forming areas on the multiple wiring substrate. Thus, for enhancing the utilization factor of the multiple wiring substrate for products it is effective to adopt a molding die of the center gate structure.

In the manufacture of a BGA type semiconductor device there generally is employed a molding die of the corner gate structure, while a molding die of the center gate structure is little employed. Having made experiments using a molding die of the center gate structure, the present inventors found out the following problems.

FIGS. 34 to 36 are schematic plan views showing the flow of resin poured into the interior of a cavity. In these figures, the reference numeral 60 denotes a substrate, numeral 61 denotes a semiconductor chip, numeral 61a denotes a main surface of the semiconductor chip, 62 a cavity, 63 a resin pouring gate, 64 a runner, 65 an air vent, 66 resin, 67 a void, and M a resin pouring direction.

The main surface 61a of the semiconductor chip 61 and the main surface of the cavity 62 opposed thereto are each formed in a rectangular shape. The sides of the main surface of the cavity 62 extend along the sides of the main surface 61a of the semiconductor chip 61. The resin pouring gate 63 is provided at a central part of a side face which extends along one of two opposite short sides of the main surface of the cavity 62. The semiconductor chip 61 is disposed on a main surface of the substrate 60 in such a manner that one of two opposite shorts sides of the chip main surface is opposed to one short side (the side where the resin pouring gate is provided) of the cavity 62. On the other short side of the cavity 62 are formed plural air vents 65.

Resin 66 is poured from a pot into the cavity 62 through the runner 64 and resin pouring gate 63. The resin 66 thus poured into the cavity 62 flows from one short side of the cavity 62 toward the other short side, as shown in FIGS. 34 and 35, and is charged into the cavity, as shown in FIG. 36. At this time, as shown in FIG. 36, a void 67 was formed in a side position along the other short side (the short side distant from the resin pouring gate 63) of the semiconductor chip 61. In the transfer molding method, after the end of resin fill, a pressure higher than the resin pouring pressure is applied to diminish the void included in the resin. But even after this pressurizing step the void 67 did not become smaller to the extent of not causing a popcorn phenomenon in a temperature cycle test. The presence of such a void causes a lowering in yield of the semiconductor device, so for enhancing the utilization factor of the multiple wiring substrate with use of a molding die of a center gate structure, it is necessary to prevent the occurrence of void 67.

In this connection the present inventors have taken note of the following point. As shown in FIG. 34, the flow of resin at the central portion of the main surface 61a of the semiconductor chip 61 is slower than the flow of resin on the long sides of the chip. Further, as shown in FIG. 35, before the resin present centrally of the main surface 61a of the semiconductor chip 61 passes the other short side (the short side distant from the resin pouring gate 63) of the chip, the resin present on the long sides of the chip strikes against the side face which extends along the other short side of the cavity 62 and flows curvedly toward the central part of the other short side of the chip 61. Therefore, we paid attention to the fluidity of the resin present in the interior of the cavity 62 and found out a first problem involved in the prior art.

Though not shown, if plural pads formed as connections on the main surface 61a of the semiconductor chip 61 and plural pads formed as connections on the main surface of the substrate 60 are arranged along the long sides of the semiconductor chip, an angle of intersection between the pads on the semiconductor chip 61 and the pads on the substrate 60 approaches 90°, so that a short-circuit between bonding wires caused by flowing of the resin becomes easier to occur. We have found out a second problem that this short-circuit between bonding wires causes a lowering in yield of the semiconductor device.

It is an object of the present invention to provide a technique which can suppress the occurrence of void.

It is another object of the present invention to provide a technique which can improve the manufacturing yield of a semiconductor device.

It is a further object of the present invention to provide a technique which can attain both reduction in cost and improvement in yield of a semiconductor device.

The above and other objects and novel features of the present invention will become apparent from the following description and the accompanying drawings.

The following is a brief description of typical inventions out of those disclosed herein.

(1) A method of manufacturing a semiconductor device, comprising the steps of:

providing a semiconductor chip having a quadrangular main surface, a wiring substrate with the semiconductor chip disposed on a main surface thereof, and a molding die having a cavity and a resin pouring gate, the cavity having a quadrangular main surface which confronts the main surface of the semiconductor chip, the resin pouring gate being formed in a side face extending along a first side of the main surface of the cavity; and positioning the wiring substrate in the molding die in such a manner that the main surface of the semiconductor chip and the main surface of the cavity confront each other and that a first side of the main surface of the semiconductor chip confronts the first side of the main surface of the cavity, and thereafter pouring resin into the cavity through the resin pouring gate to seal the semiconductor chip with the resin, wherein the resin sealing step for the semiconductor chip is carried out in a state in which, in a section orthogonal to a second side of the main surface of the semiconductor chip which intersects the first side of the main surface of the semiconductor chip, a sectional area of an area between the main surface of the wiring substrate and the main surface of the cavity at a position outside a side face along the extending direction of the second side of the main surface of the semiconductor chip is smaller than a sectional area of an area between the main surface of the semiconductor chip and the main surface of the cavity.

(2) A semiconductor device comprising:

a semiconductor chip having a quadrangular main surface;

a wiring substrate with the semiconductor chip disposed on a main surface thereof;

a resin seal member for sealing the semiconductor chip, the resin seal member having a quadrangular main surface which confronts the main surface of the semiconductor chip; and a gate cut trace portion formed on a side face extending along a first side of the main surface of the resin seal member, the first side of the main surface of the resin seal member extending along a first side of the main surface of the semiconductor chip, the main surface of the resin seal member having a second side which intersects the first side thereof and which extends along a second side intersecting the first side of the main surface of the semiconductor chip, wherein, in a section orthogonal to the second side of the main surface of the semiconductor chip, a sectional area of an area between the main surface of the wiring substrate and the main surface of the resin seal member at a position outside a side face of the semiconductor chip is smaller than a sectional area of an area between the main surface of the semiconductor chip and the main surface of the resin seal member.

(3) A method of manufacturing a semiconductor device, comprising the steps of:

providing a semiconductor chip having a quadrangular main surface, a wiring substrate with the semiconductor chip disposed on a main surface thereof, and a molding die having a cavity and a resin pouring gate, the cavity having a quadrangular main surface which confronts the main surface of the semiconductor chip, the resin pouring gate being formed in a side face extending along a first side of the main surface of the cavity; and positioning the wiring substrate in the molding die in such a manner that the main surface of the semiconductor chip and the main surface of the cavity confront each other, the first side of the main surface of the cavity extends along a first side of the main surface of the semiconductor chip, a second side which intersects the first side of the main surface of the cavity extends along a second side which intersects the first side of the main surface of the semiconductor chip, a third side which confronts the first side of the main surface of the cavity extends along a third side which confronts the first side of the main surface of the semiconductor chip, and a fourth side which confronts the second side of the main surface of the cavity extends along a fourth side which confronts the second side of the main surface of the semiconductor chip, and thereafter pouring resin into the cavity through the resin pouring gate to seal the semiconductor chip with the resin, wherein the resin sealing step for the semiconductor chip is carried out in a state in which the distance from a side face extending along the third side of the main surface of the semiconductor chip to a side face extending along the third side of the main surface of the cavity is longer than the distance from a side face extending along the second side of the main surface of the semiconductor chip to a side face extending along the second side of the main surface of the cavity and is longer than the distance from a side face extending along the fourth side of the main surface of the semiconductor chip to a side face extending along the fourth side of the main surface of the cavity.

(4) A semiconductor device comprising:

a semiconductor chip having a quadrangular main surface;

a wiring substrate with the semiconductor chip disposed on a main surface thereof;

a resin seal member for sealing the semiconductor chip, the resin seal member having a quadrangular main surface which confronts the main surface of the semiconductor chip, with a gate cut trace portion being formed on a side face extending along a first side of the main surface of the resin seal member, wherein the first side of the main surface of the resin seal member extends along a first side of the main surface of the semiconductor chip, a second side which intersects the first side of the main surface of the resin seal member extends along a second side which intersects the first side of the main surface of the semiconductor chip, a third side which confronts the first side of the main surface of the resin seal member extends along a third side which confronts the first side of the main surface of the semiconductor chip, and a fourth side which confronts the second side of the main surface of the resin seal member extends along a fourth side which confronts the second side of the main surface of the semiconductor chip, and wherein the distance from a side face extending along the third side of the main surface of the semiconductor chip to a side face extending along the third side of the main surface of the resin seal member is longer than the distance from a side face extending along the second side of the main surface of the semiconductor chip to a side face extending along the second side of the main surface of the resin seal member and is longer than the distance from a side face extending along the fourth side of the main surface of the semiconductor chip to a side face extending along the fourth side of the main surface of the resin seal member.

(5) A semiconductor device comprising:

a semiconductor chip having a quadrangular main surface;

a wiring substrate with the semiconductor chip disposed on a main surface thereof;

a plurality of first connections formed on the main surface of the semiconductor chip and arranged in an extending direction of a first side of the main surface of the semiconductor chip;

a plurality of second connections formed on the main surface of the wiring substrate at a position outside the first side of the main surface of the semiconductor chip and arranged in the extending direction of the first side of the main surface of the semiconductor chip;

a plurality of bonding wires for electrically connecting the plural, first and second connections with each other;

a resin seal member for sealing the semiconductor chip, the plural, first and second connections and the plural bonding wires, the resin seal member having a quadrangular main surface which confronts the main surface of the semiconductor chip, the main surface of the resin seal member having a first side extending along the first side of the main surface of the semiconductor chip; and a gate cut trace portion formed on a side face extending along the first side of the main surface of the resin seal member.

BRIEF DESCRIPTION OF THE DRAWINGS

FIG. 4 is a sectional view taken along line a—a in FIG. 2;

FIG. 5 is a sectional view taken along line b—b in FIG. 2;

FIG. 6 is a partially enlarged sectional view of FIG. 4;

FIG. 7 is an enlarged sectional view of FIG. 5;

DETAILED DESCRIPTION OF THE PREFERRED EMBODIMENTS

Figure 1:
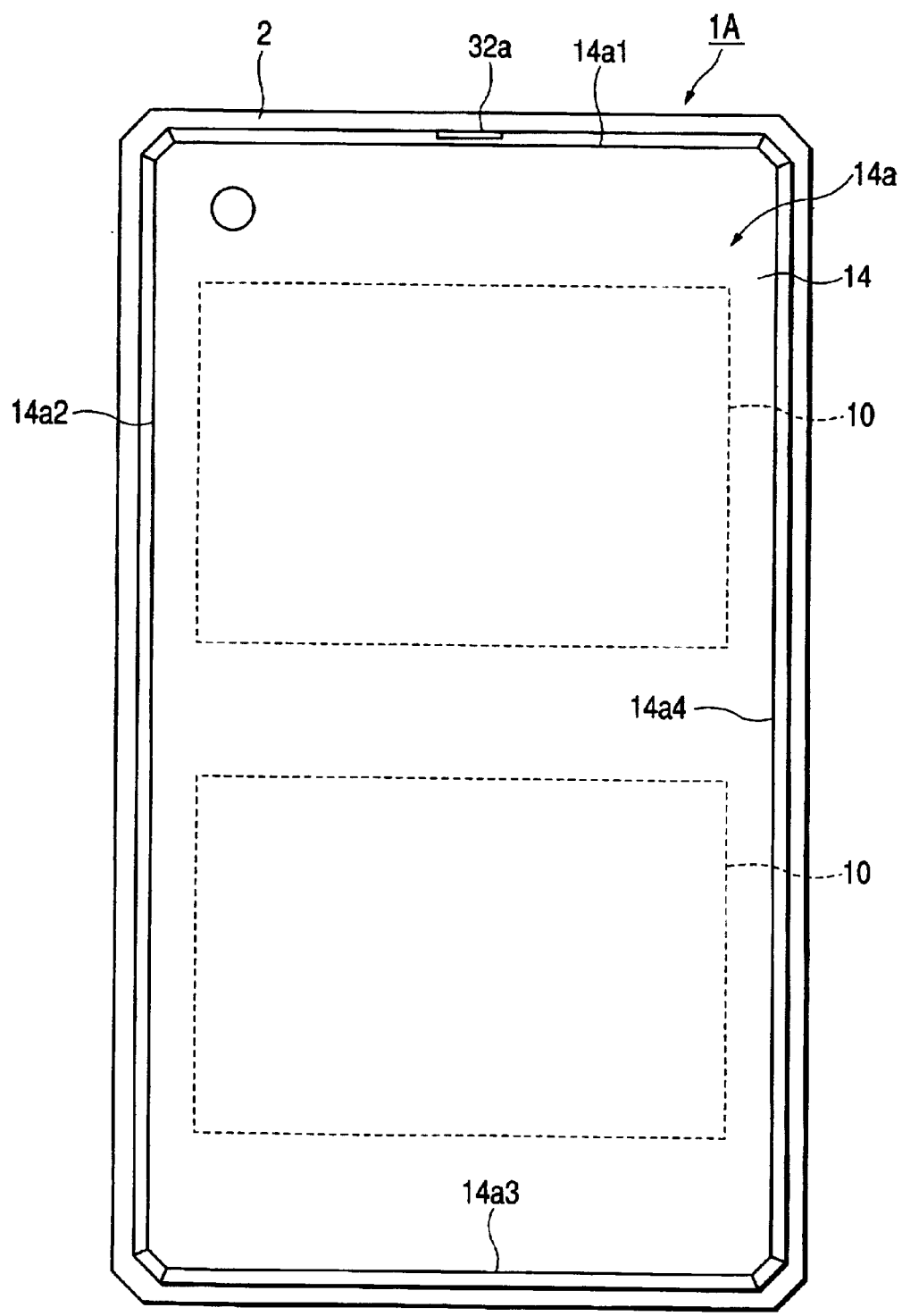
FIG. 1 is a plan view of a semiconductor device according to a first embodiment of the present invention.

Embodiments of the present invention will be described in detail hereinunder with reference to the accompanying drawings. In all of the drawings for illustrating the embodiments, portions of like functions are identified by like reference numerals, and as to those portions, repeated explanations will be omitted.

(First Embodiment)

Figure 2:
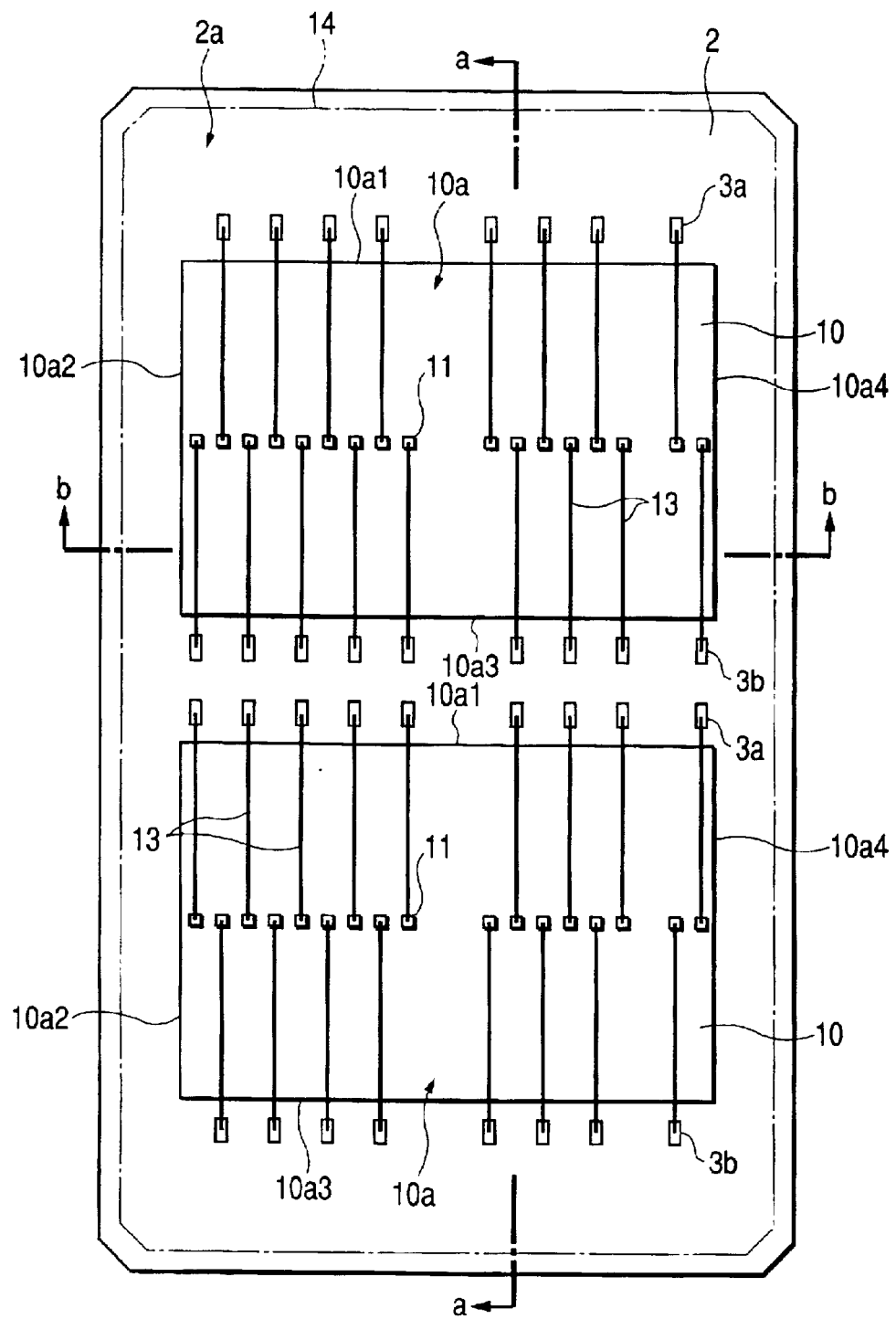
FIG. 2 is a plan view of the semiconductor device with a resin seal member removed.
Figure 3:
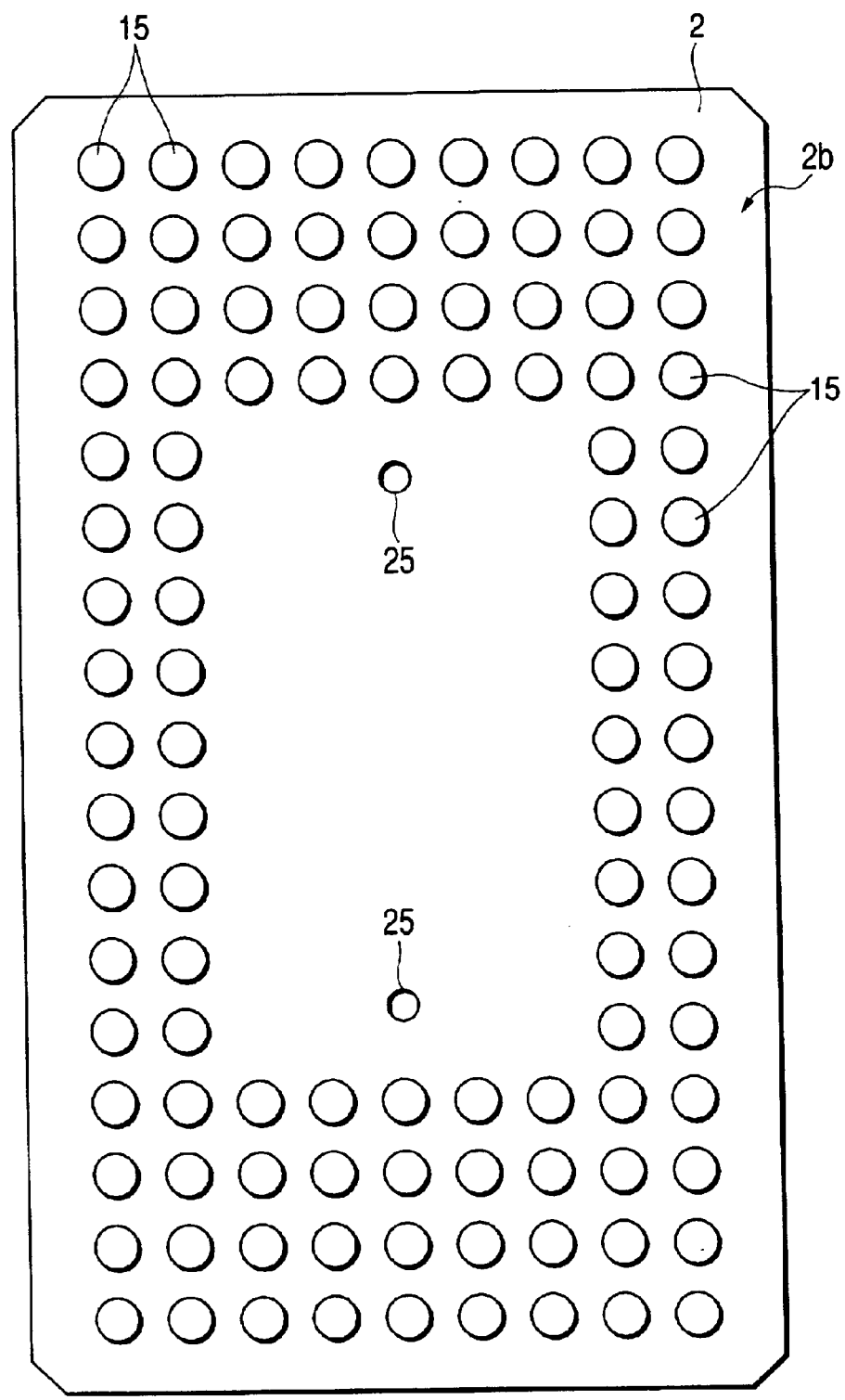
FIG. 3 is a bottom view of the semiconductor device shown in FIG. 1.
Figure 8:
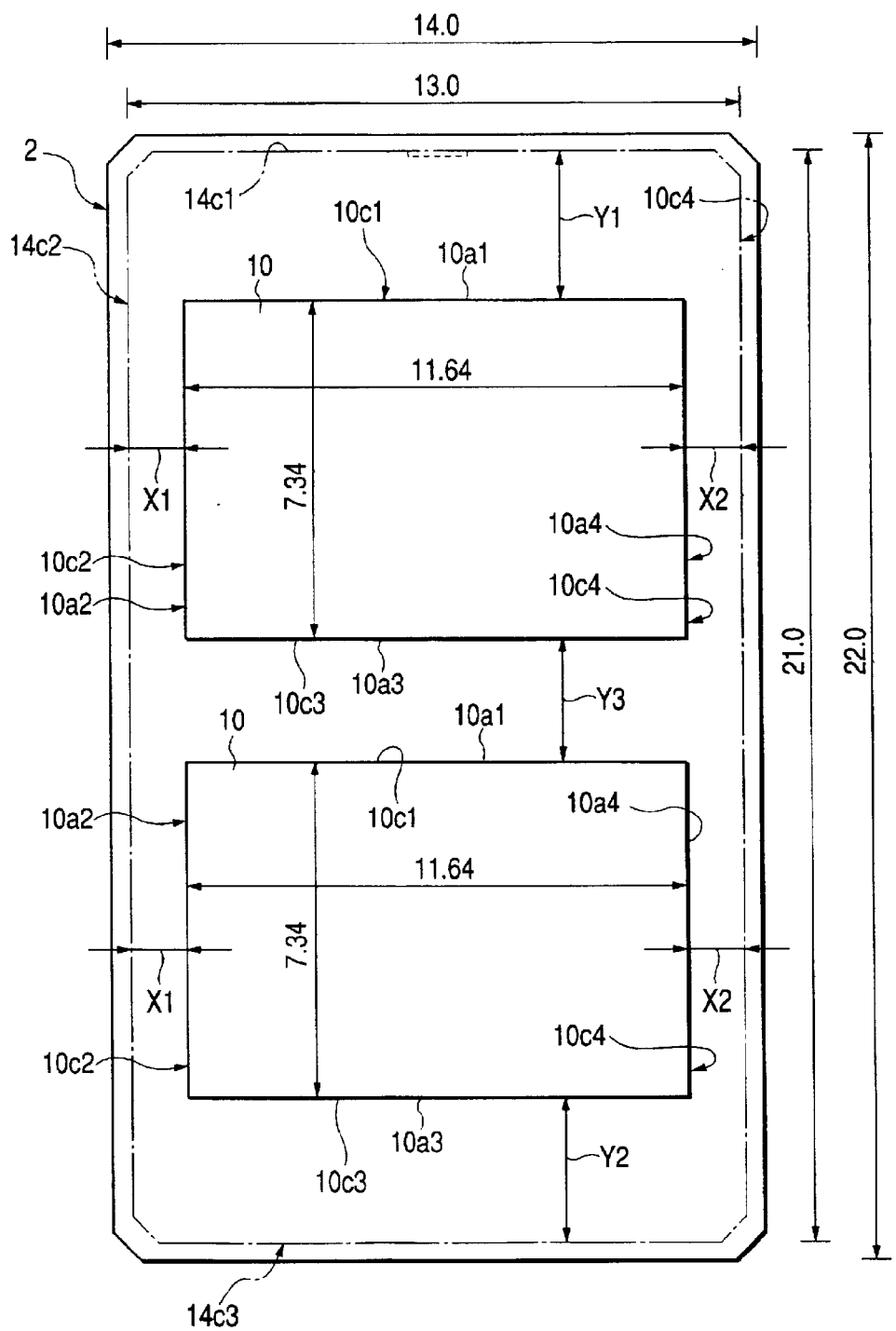
FIG. 8 is a plan view showing a layout of semiconductor chips in the semiconductor device of FIG. 1.

FIG. 1 is a plan view of a semiconductor device according to a first embodiment of the present invention, FIG. 2 is a plan view of the semiconductor device with a resin seal member removed, FIG. 3 is a bottom view of the semiconductor device, FIG. 4 is a sectional view taken along line a—a in FIG. 2, FIG. 5 is a sectional view taken along line b—b in FIG. 2, FIG. 6 is a partially enlarged sectional view of FIG. 4, FIG. 7 is an enlarged sectional view of FIG. 5, and FIG. 8 is a plan view showing a layout of semiconductor chips.

As shown in FIGS. 1 to 5, a semiconductor device 1A of this embodiment mainly comprises a wiring substrate 2, two semiconductor chips 10, plural bonding wires 13, a resin seal member 14, and plural ball bumps 15 as terminals for external connection. The two semiconductor chips 10 and the plural bonding wires 13 are sealed with the resin seal member 14.

The two semiconductor chips 10 are bonded and fixed through an adhesive layer 12 to a main surface 2a of the wiring substrate 2 out of the main surface 2a and another main surface (back side) 2b opposed to each other of the wiring substrate. A main surface (a circuit forming surface) 10a of each of the two semiconductor chips 10 is formed in a quadrangular shape, e.g., a rectangular shape in this embodiment. Each semiconductor chip 10 comprises a semiconductor substrate formed of a single crystal silicon for example, a multi-layer interconnection formed by plural stages of insulating layers and conductive layers stacked on a circuit forming surface of the semiconductor substrate, and a surface protecting film formed so as to cover the multi-layer interconnection.

In the two semiconductor chips 10 are respectively incorporated, for example, DRAMs (Dynamic Random Access Memory) of the same function as integrated circuits. Each DRAM is mainly composed of plural transistors (semiconductors) formed on the circuit forming surface of the semiconductor substrate and plural wiring lines formed on a wiring layer.

On the main surface 10a of each semiconductor chip 10 are formed plural salient electrodes 11 as connections. The plural salient electrodes 11 are arranged along the long sides of the main surface 10a of the semiconductor chip 10 centrally of the main surface and are electrically connected through wiring lines to transistors as components of an integrated circuit (DRAM in this embodiment).

The wiring substrate 2 has a multi-layer interconnection structure wherein insulating layers and conductive layers are stacked successively, although the details will be described later. The main surface 2a of the wiring substrate 2 is formed in a quadrangular shape. In this embodiment it is in a rectangular shape.

On the main surface 2a of the wiring substrate 2 are formed plural electrode pads (lands) 3a and 3b as connections. The plural electrode pads 3a and 3b are constituted by a portion of wiring formed on the top conductive layer of the wiring substrate 2.

The plural electrode pads 3a are arranged along and outside one long side 10a1 out of two opposed long sides 10a1, 10a3 of the main surface 10a of the semiconductor chip 10. The plural electrode pads 3b are arranged along and outside the other long side 10a3 out of the two opposed long sides 10a1, 10a3 of the chip main surface 10a.

On the back side 2b of the wiring substrate 2 are formed plural electrode pads 8 as connections. The plural electrode pads 8 are constituted by a portion of wiring formed on the bottom conductive layer of the wiring substrate 2.

The plural ball bumps 15 are respectively fixed and connected electrically and mechanically to the plural electrode pads 8 formed on the back side 2b of the wiring substrate 2. For example, the ball bumps 15 are formed of silver (Ag)-tin (Sn) alloy.

The resin seal member 14 is formed on the main surface 2a of the wiring substrate 2 and a main surface 14a thereof, which confronts the main surface 10a of the semiconductor chip 10, is formed in a quadrangular shape. In this embodiment, the main surface 14a of the resin seal member 14 is formed in a rectangular shape for example. For the reduction of stress the resin seal member 14 is formed, for example, using an insulating, thermosetting epoxy resin with a phenolic curing agent, silicone rubber and a large amount of filler (e.g., silica) added thereto.

The resin seal member 14 is formed by a transfer molding method. According to the transfer molding method, a molding die provided principally with pots, culls, runners, resin pouring gates and cavities is used and an insulating resin is poured from the pots into the cavities through the culls, runners and resin pouring gates to form the resin seal member.

The two semiconductor chips are arranged in parallel at a predetermined spacing so that same sides face in the same direction. In this embodiment, the two semiconductor chips 10 are arranged in such a manner that the other long side 10a3 of one semiconductor chip 10 and one long side 10a1 of the other semiconductor chip 10 confront each other.

Of two opposed short sides 14a1, 14a3 of the resin seal member 14, one short side 14a1 extends along one long side 10a1 of one semiconductor chip 10, while the other short side 14a3 extends along the other long sides 10a3 of the other semiconductor chip 10. Of two opposed long sides 14a2, 14a4 of the resin seal member 14, one long side 14a2 extends along one short sides 10a2 of the two semiconductor chips 10, while the other long side 14a4 extends along the other short sides 10a4 of the chips 10.

Of the plural salient electrodes 11 formed on one semiconductor chip 10, plural salient electrodes 11 are electrically connected through bonding wires 13 respectively to plural electrode pads 3a which are arranged outside one long side 10a1 of the semiconductor chip 10. The bonding wires 13 for their electrical connection extend across one long side 10a1 of the semiconductor chip 10. Of the plural salient electrodes 11, the remaining plural salient electrodes 11 are electrically connected through bonding wires 13 respectively to plural electrode pads 3b which are arranged outside the other long side 10a3 of the semiconductor chip 10. The bonding wires 13 for their electrical connection extend across the other long side 10a3 of the semiconductor chip 10.

Of the plural salient electrodes 11 formed on the other semiconductor chip 10, plural salient electrodes 11 are electrically connected through bonding wires 13 respectively to plural electrode pads 3a arranged outside one long side 10a1 of the semiconductor chip 10. The bonding wires 13 for their electrical connection extend across one long side 10a1 of the semiconductor chip 10. Of the plural salient electrodes 11, the remaining salient electrodes 11 are electrically connected through bonding wires 13 respectively to plural electrode pads 3b arranged outside the other long side 10a3 of the semiconductor chip 10. The bonding wires 13 for their electrical connection extend across the other long side 10a3 of the semiconductor chip 10.

As the bonding wires 13 there are used gold (Au) wires as an example. As a method for connecting the bonding wires 13 there is adopted, for example, a ball bonding (nail head bonding) method as a combination of both thermocompression bonding and ultrasonic oscillation.

In this embodiment the bonding wires 13 are connected by a reverse bonding method in which the electrode pads 3a, 3b on the wiring substrate 2 are first bonds and the salient electrodes 11 on the semiconductor chip 10 are second bonds. That is, each bonding wire 13 used in this embodiment has a first portion extending in a direction perpendicular to the main surface 2a of the wiring substrate 2 and a second portion extending along the main surface 10a of the semiconductor chip 10.

FIGS. 6 and 8 show principal dimensions of the semiconductor device 1A. In FIG. 6, the thickness of the wiring substrate 2 is, for example, 0.6 mm or so, the thickness of each semiconductor chip 10 is, for example, 0.4 mm or so, the thickness of the resin seal member 14 is, for example, 0.9 mm or so, the distance from the center of each electrode pad 3a, 3b on the wiring board 2 to the center of each salient electrode 11 on each semiconductor chip 10 is, for example, 4.6 mm or so as maximum, the distance from the center of each electrode pad 3a, 3b to a side face of each semiconductor chip 10 is, for example, 0.535 mm or so, and the distance from the center of each electrode pad 3a to the center of each electrode pad 3b is, for example, 0.88 mm or so.

In FIG. 8, a plane size of the semiconductor chip 10 (size of the main surface 10a) is, for example, 7.34 mm×11.64 mm or so, a plane size of the resin seal member 14 (size of the bottom opposite to the main surface 14) is, for example, 13.0 mm×21.0 mm or so, and a plane size of the wiring substrate 2 (size of the main surface 2a) is, for example, 14.0 mm×22.0 mm or so.

In the resin seal member formed by the molding die, side faces thereof are somewhat inclined relative to the main surface to facilitate extraction of the resin seal member from the cavity. Therefore, the plane size of the main surface 14a of the resin seal member 14 is a little smaller than the bottom size.

As shown in FIG. 7, in a section orthogonal to each short side 10a2, 10a4 of each semiconductor chip 10, a sectional area S2 of an area between the main surface 2a of the wiring substrate 2 and the main surface 14a of the resin seal member 14 at a position outside a side face extending along each short side 10a2, 10a4 of the semiconductor chip 10 is smaller than one half of a sectional area S1 of an area between the main surface 10a of the semiconductor chip and the main surface 14a of the resin seal member 14. In this embodiment the sectional area S2 is 0.577 mm$^2$ or so and the sectional area S1 is 4.66 mm$^2$ or so. Thus, a total sectional area of two sectional areas S2 is smaller than the sectional area S1.

As shown in FIG. 8, the distance (distance on the main surface 2a side of the wiring substrate 2) X1 from a side face 10c2 extending along one short side 10a2 of each of one and the other semiconductor chips 10 to a side face 14c2 extending along one long side 14a2 of the resin seal member 14, and the distance (distance on the main surface 2a side of the wiring substrate 2) X2 from a side face 10c4 extending along the other short side 10a4 of each of one and the other semiconductor chips 10, are shorter than the distance (distance on the main surface 2a side of the wiring substrate 2) Y1 from a side face 10c1 extending along one long side 10a1 of one semiconductor chip 10 to a side face 14c1 extending along one short side 14a1 of the resin seal member 14, are shorter than the distance (distance on the main surface 2a side of the wiring substrate 2) Y2 from a side face 10c3 extending along the other long side 10a3 of the other semiconductor chip 10 to a side face 14c3 extending along the other short side 14a3 of the resin seal member 14, and are further shorter than the distance (distance on the main surface 2a side of the wiring substrate 2) Y3 from the side face 10c3 extending along the other long side 10a3 of one semiconductor chip 10 to the side face 10c1 extending along one long side 10a1 of the other semiconductor chip 10. The distance Y3 is shorter than the distances Y1 and Y2. In this embodiment, the distances Y1 and Y2 are each, for example, 2.18 mm or so, the distance Y3 is, for example, 1.95 mm or so, and the distances X1 and X2 are each, for example, 0.68 mm or so.

Figure 9:
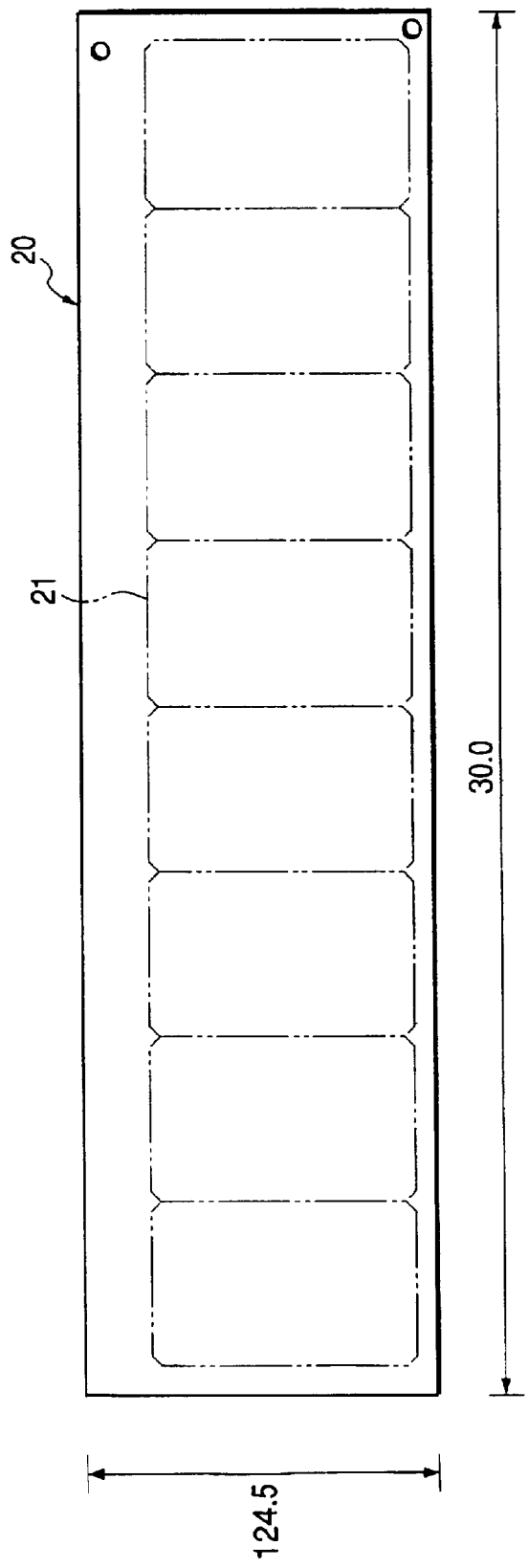
FIG. 9 is a plan view of a multiple wiring substrate used in the manufacture of the semiconductor device of FIG. 1.
Figure 10:
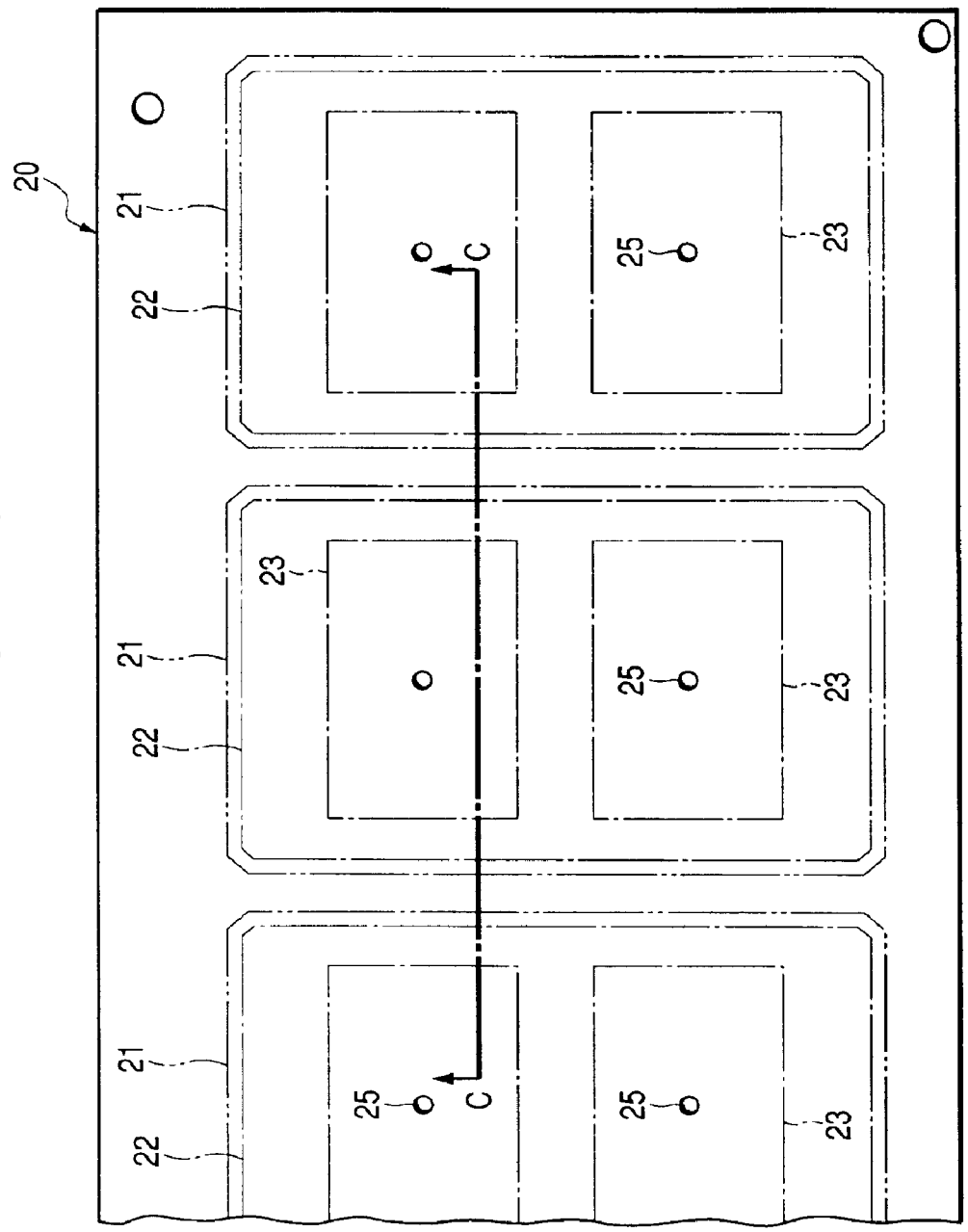
FIG. 10 is a partially enlarged plan view of FIG. 9.
Figure 11:
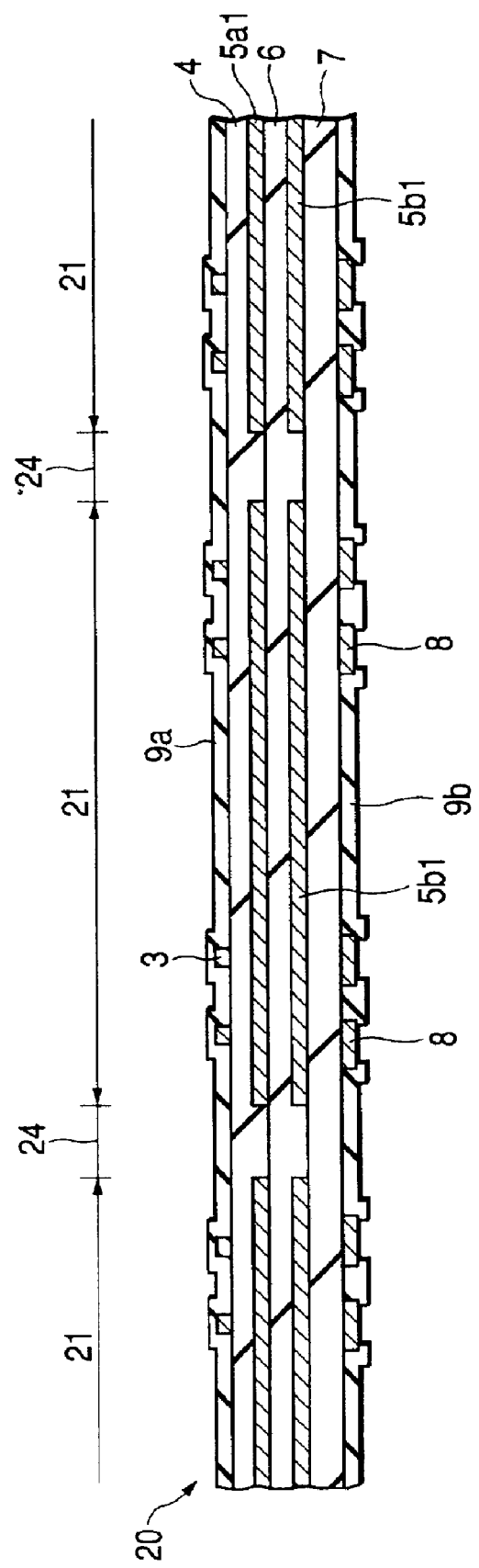
FIG. 11 is a sectional view taken along line c—c in FIG. 10.
Figure 12:
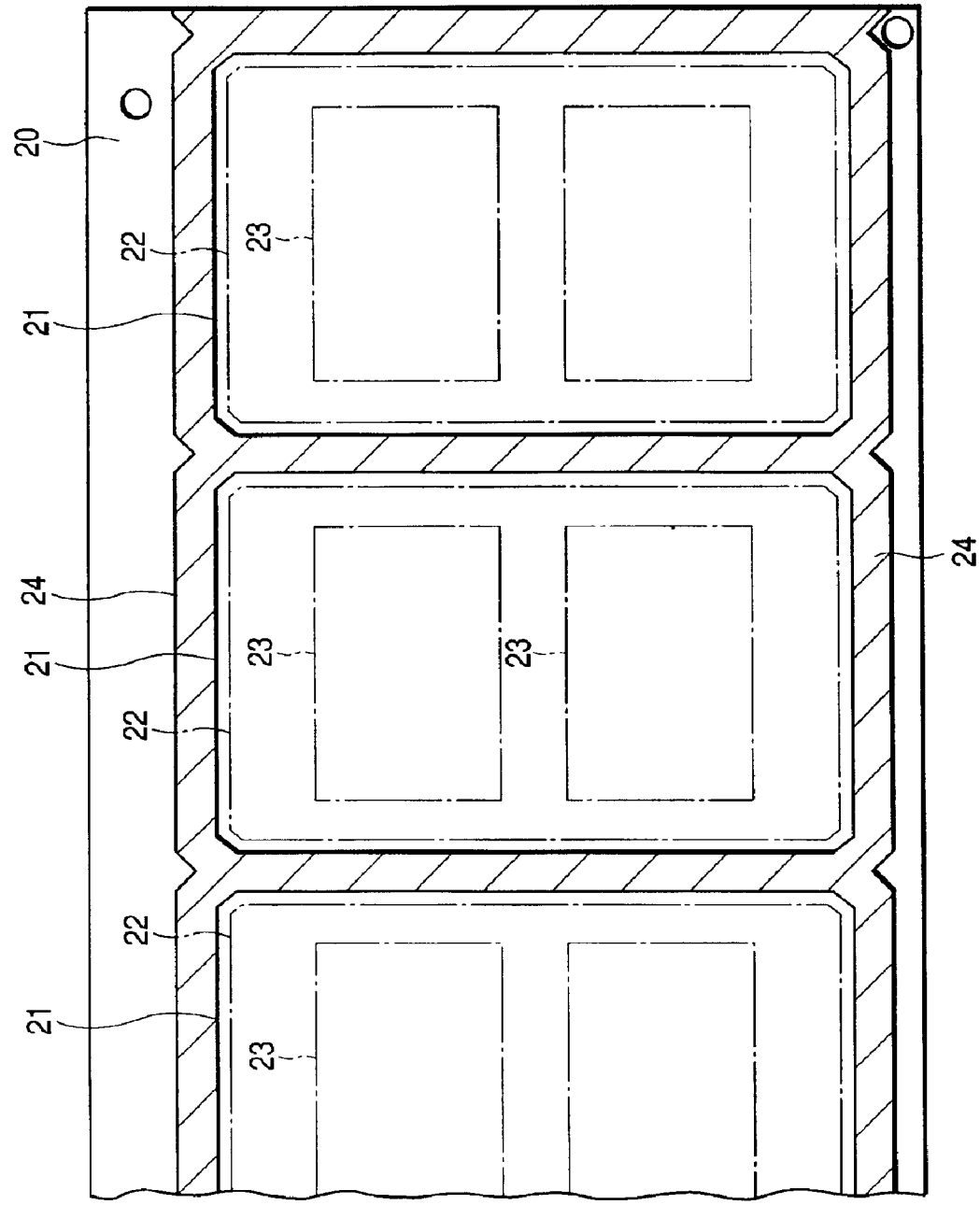
FIG. 12 is a diagram showing a separating area for the multiple wiring substrate of FIG. 9.
Figure 13:
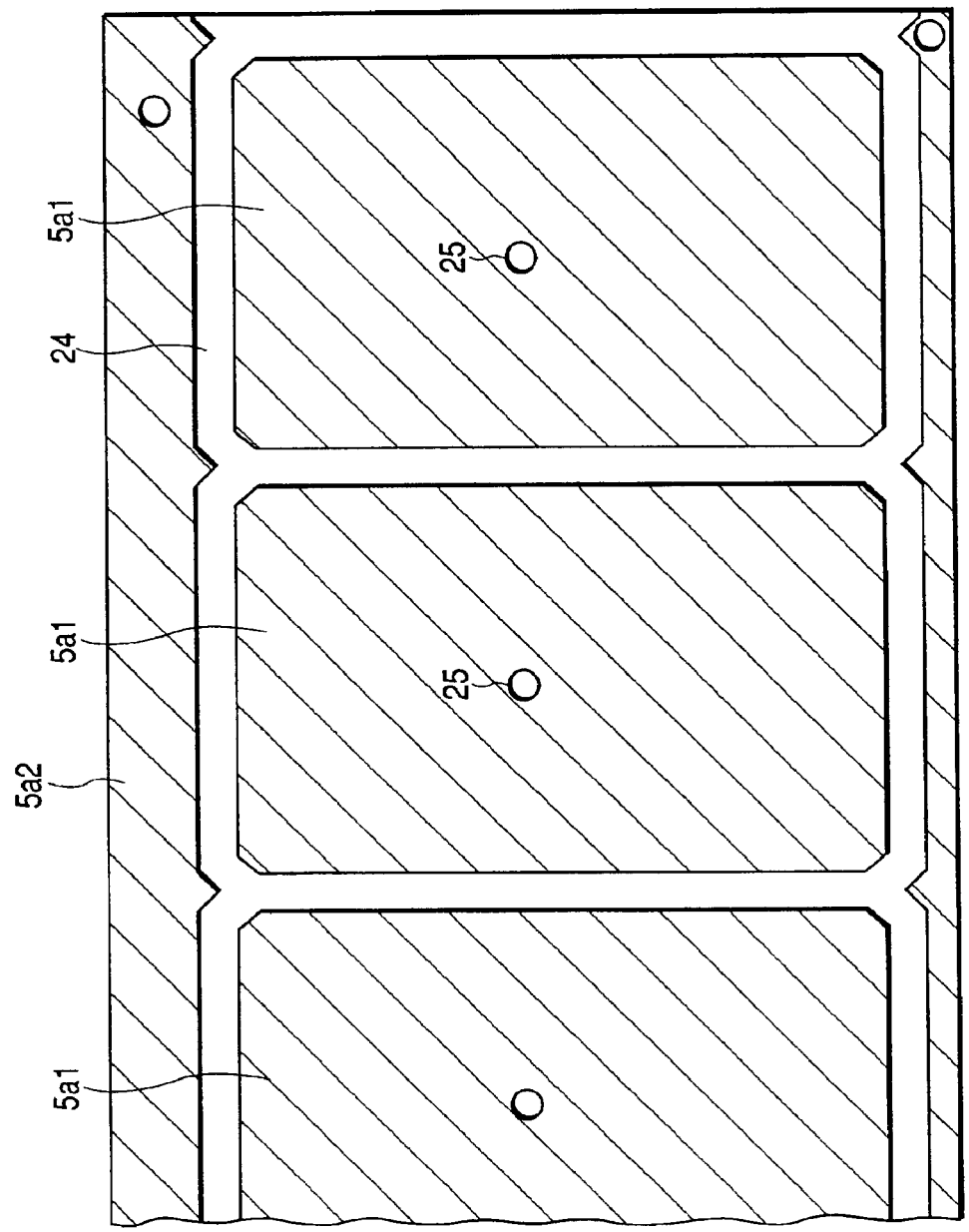
FIG. 13 is a diagram showing inner-layer patterns in the multiple wiring substrate of FIG. 9.
Figure 14:
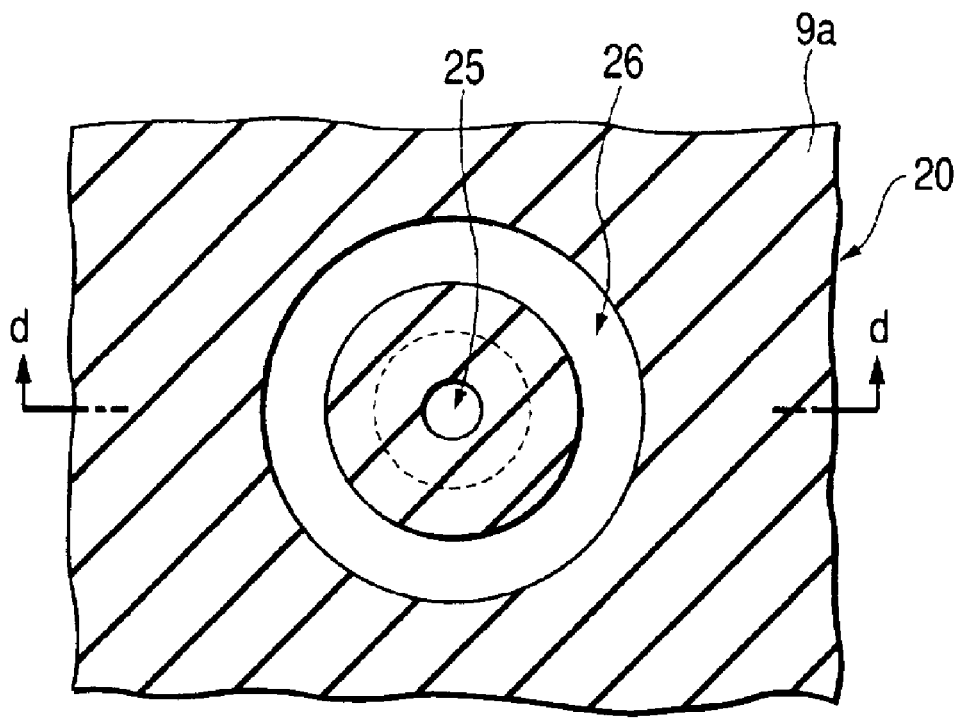
FIG. 14 is a partially enlarged plan view of FIG. 10.
Figure 15:
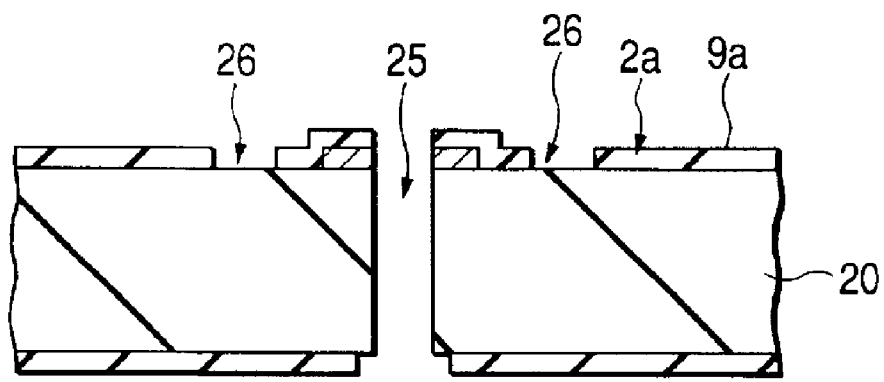
FIG. 15 is a sectional view taken along line d—d in FIG. 10.

FIG. 9 is a plan view of a multiple wiring substrate used in manufacturing the semiconductor device of FIG. 1, FIG. 10 is a partially enlarged plan view of FIG. 10, FIG. 11 is a sectional view taken along line c—c in FIG. 10, FIG. 12 illustrates a separating area of the multiple wiring substrate of FIG. 9, FIG. 13 illustrates inner-layer patterns in the multiple wiring substrate of FIG. 9, FIG. 14 is a partially enlarged plan view of FIG. 10, and FIG. 15 is a sectional view taken along line d—d in FIG. 10.

As shown in FIGS. 9 and 10, the multiple wiring substrate 20 has plural substrate forming areas (product forming areas) 21 arranged longitudinally at predetermined spacings. In this embodiment the multiple wiring substrate 20 has eight substrate forming areas 21. In each substrate forming area 21 is provided a resin seal member forming area 22, within which are provided two chip mounting areas 23. A plane shape of the multiple wiring substrate 20 is a rectangular shape of, for example, 12.45 mm×30.0 mm.

Centrally of each chip mounting area 23 is formed a vent hole 25 extending from one main surface of the multiple wiring substrate 20 and reaching another main surface of the substrate opposite to the one main surface.

As shown in FIGS. 11 and 12, each substrate forming area 21 of the multiple wiring substrate 20 is surrounded with a separating area 24. The wiring substrate 2 described previously is formed by cutting the separating area with a cutting tool called bit for example to cut out the substrate forming area 21. The resin seal member 14 used in this embodiment is formed by a transfer molding method which uses a molding die of the center gate structure. Therefore, even if the spacing between adjacent cavities is set narrow, there is no fear that a runner extended to a central part of one side face of a cavity may come into contact with another cavity, thus making it possible to narrow the cavity-to-cavity spacing and hence narrow the spacing between adjacent resin seal member forming areas 22 of the multiple wiring substrate 20. In this embodiment, the spacing between adjacent substrate forming areas 21 and the width of the separating area 24 are each set at, for example, 1.5 mm or so.

As shown in FIG. 11, the multiple wiring substrate 20 has a multi-layer interconnection structure in which insulating layers and conductive layers are stacked successively. In this embodiment four conductive layers and three insulating layers 4, 6, 7 are formed. For example, each insulating layer is formed by a glass fabric-based epoxy resin board comprising glass fabric impregnated with an epoxy resin, and each conductive layer is formed by a metallic film, for example, copper (Cu) film.

In the first conductive layer are formed plural wiring lines 3 and plural electrode pads 3a, 3b which are constituted by a portion of the wiring lines 3. In the fourth conductive layer are formed plural wiring lines and plural electrode pads 8 which are constituted by a portion of the wiring lines. These wiring lines and electrode pads are positioned within each substrate forming area 21.

In the second conductive layer, as shown in FIGS. 11 and 13, there are formed ground plates 5a1 and conductive patterns 5a2 extending respectively along both long sides of the multiple wiring substrate 20. Each ground plate 5a1 is provided in each substrate forming area 21, while the conductive patterns 5a2 are formed while avoiding the separating area 24. In the third conductive layer, as shown in FIG. 11, there are formed power-supply plates 5b1 and conductive patterns like the patterns formed in the second layer. Each power-supply plate 5b1 is provided in each substrate forming area 21 and the conductive patterns are formed so as to avoid the separating area 24. In each of the conductive layers formed with the ground plates 5a1 or the power-supply plates 5b1 there is formed an aperture pattern beforehand in the portion of the separating area 24, the aperture pattern being larger than the width to be cut by a bit (or a router). That is, each conductive layer is provided in an area diverted from the separating area 24. The conductive layers are formed of a material harder than the material of the insulating layers. Thus, by providing each conductive layer in an area diverted from the separating area 24, it is possible to suppress the wear of the cutting tool which is used when cutting the separating area 24 to cut out the substrate forming areas 21.

If the ground plates 5a1 and the surrounding conductive patterns 5a2, or the power-supply plates 5b1 and the surrounding conductive patterns, are separated from each other even partially, this will be somewhat effective in attaining a wear suppressing effect.

On one and the other main surface opposed to each other of the multiple wiring substrate 20 there are formed insulating films 9a, 9b using an epoxy or polyimide resin for example with a view to protecting the wiring lines on the top and bottom layers. In the insulating films 9a, 9b are formed apertures for exposing the surfaces of the electrode pads 3a, 3b, 8.

In the ground plates 5a1 and the power-supply plates 5b1 are formed plural through holes (not shown).

On the main surface of the multiple wiring substrate 20, as shown in FIGS. 14 and 15, there are formed dams 26 so as to surround the vent holes 25 respectively. The dams 26 are constituted by conductor patterns and insulating film 9a formed on the main surface of the multiple wiring substrate 20.

Figure 16:
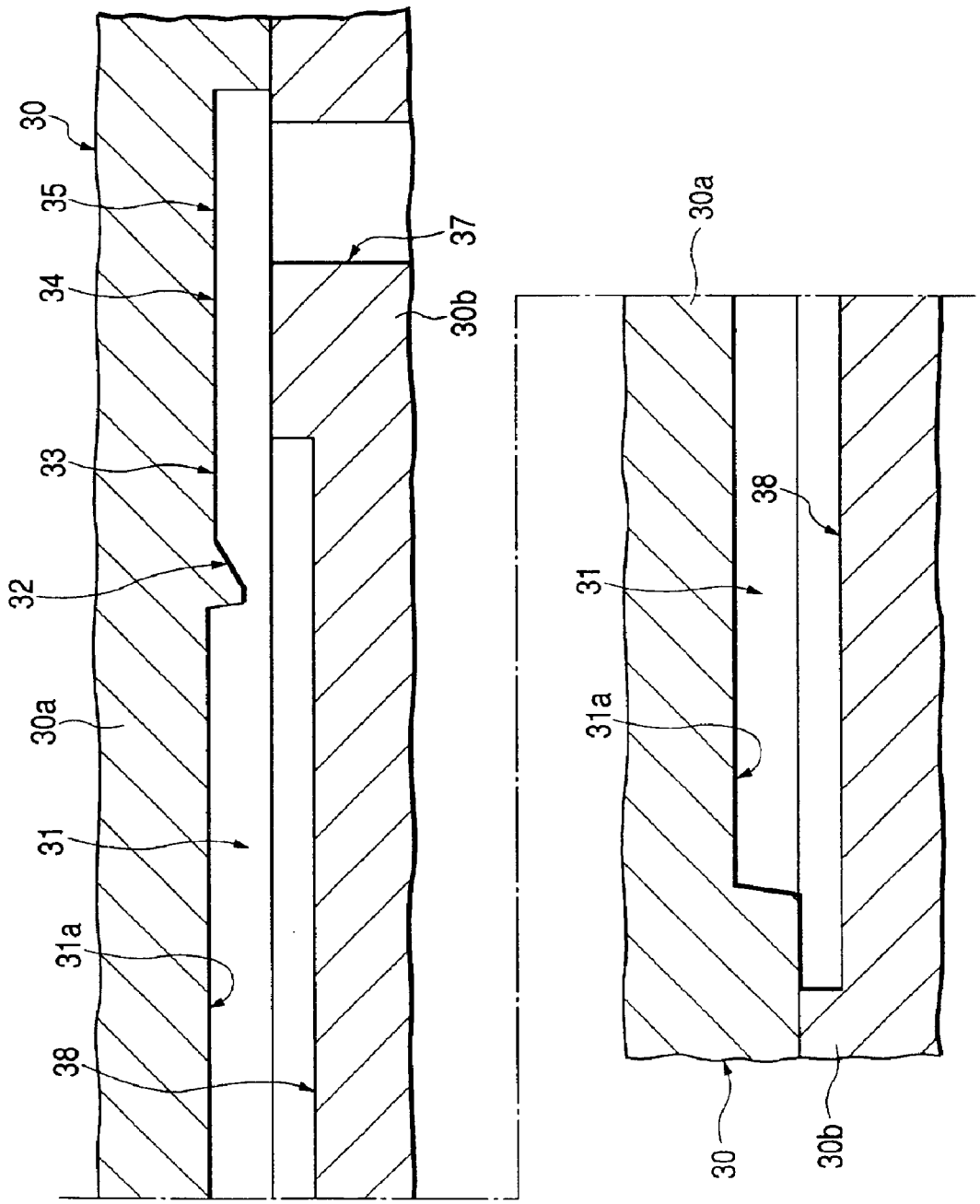
FIG. 16 is a sectional view of a principal portion, showing a schematic construction of a molding die used in manufacturing the semiconductor device of FIG. 1.
Figure 17:
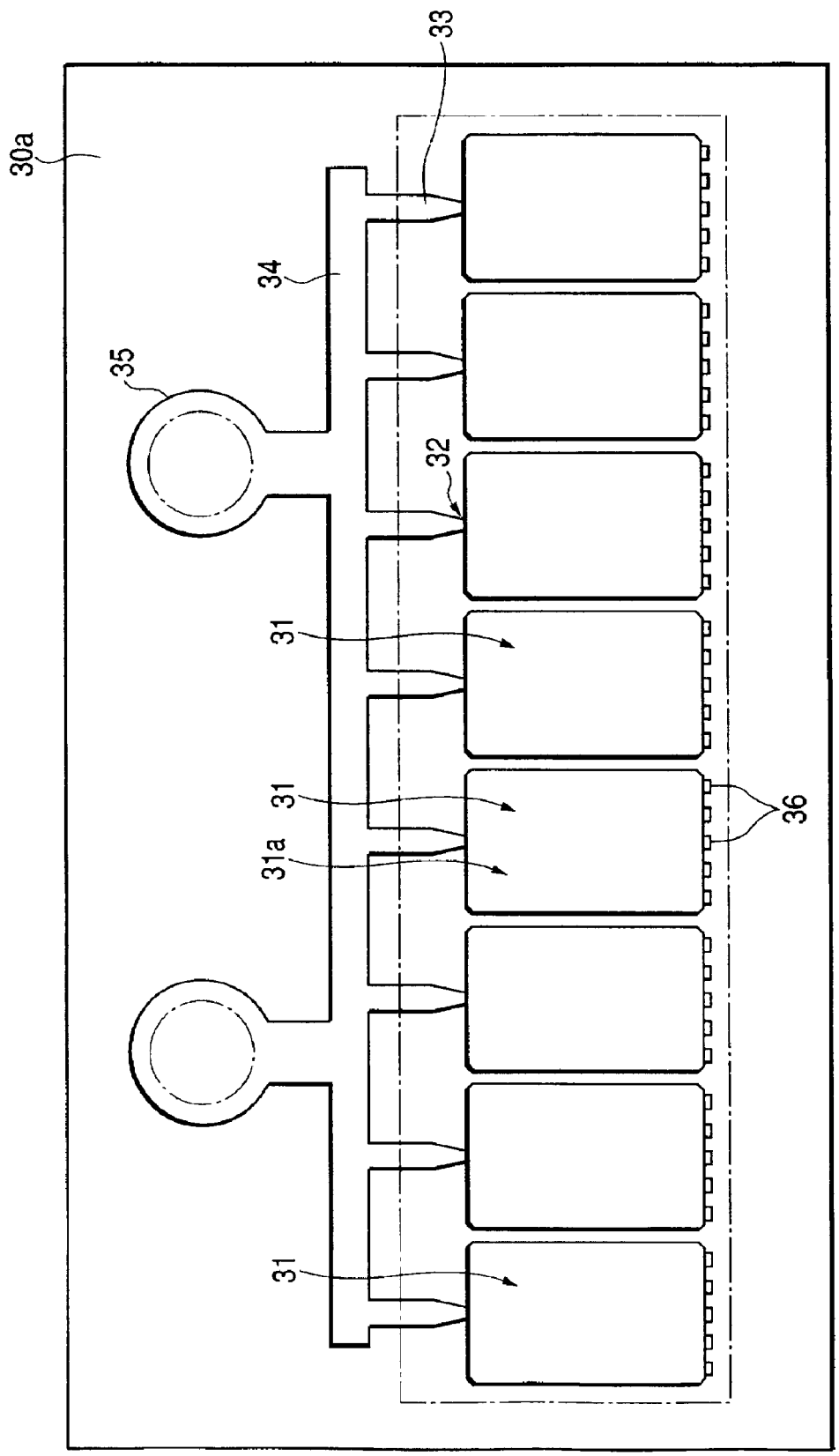
FIG. 17 is a plan view of an upper mold in the molding die of FIG. 16.
Figure 18:
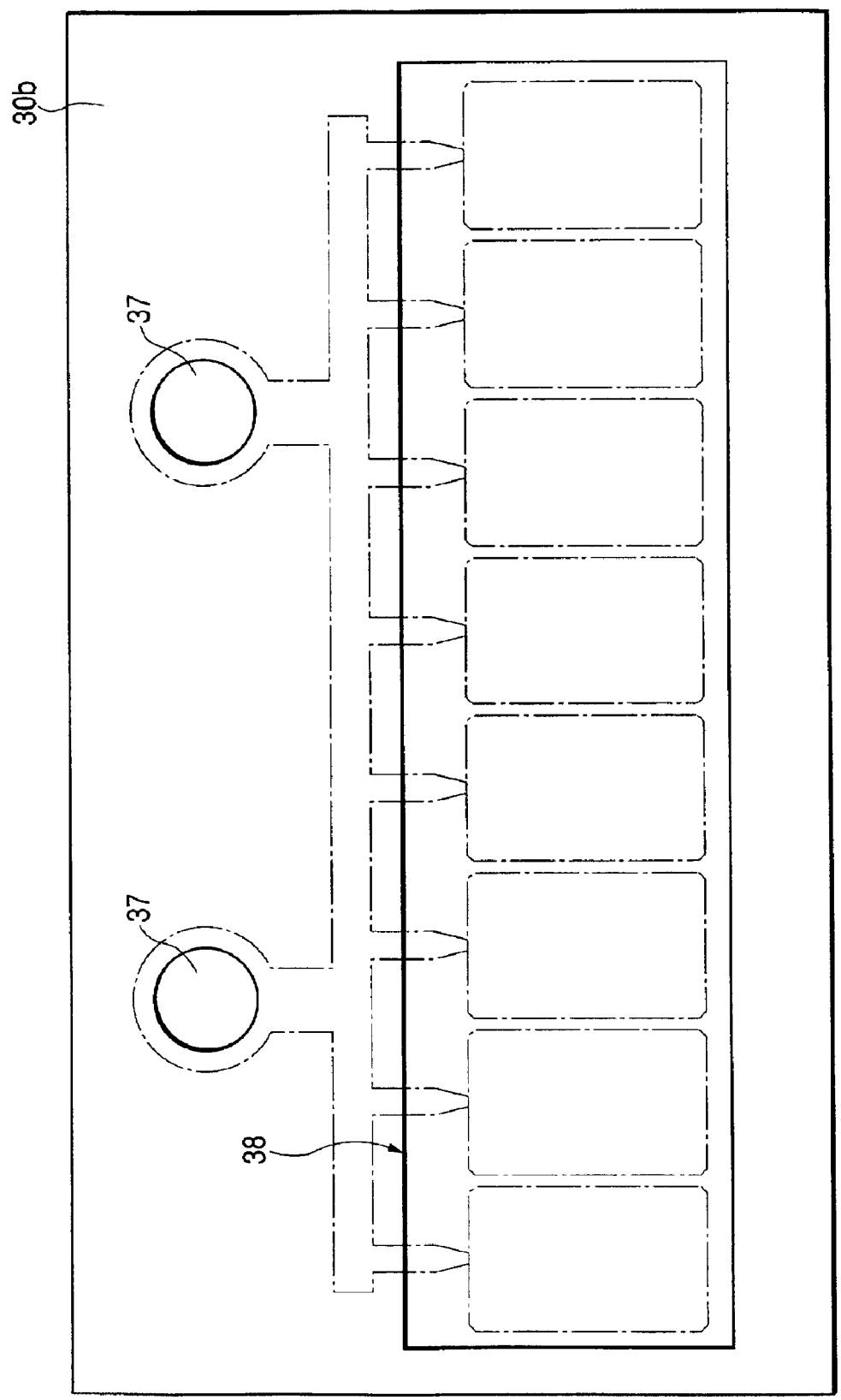
FIG. 18 is a plan view of a lower mold in the molding die of FIG. 16.

FIG. 16 is a sectional view of a principal portion, showing a schematic construction of a molding die which is used in manufacturing the semiconductor device of FIG. 1, FIG. 17 is a plan view of an upper mold in the molding die of FIG. 16, and FIG. 18 is a plan view of a lower mold in the molding die of FIG. 16.

As shown in FIGS. 16 to 18, a molding die 30 is principally provided with eight cavities 31, eight resin pouring gates 32, eight sub-runners 33, one main runner 34, two culls 35, plural air vents 36, two pots 37, and one substrate mounting area 38, though no limitation is made thereto. The components 31 to 36 are provided on an upper mold 30a side, while the components 37 and 38 are provided on a lower mold 30b side. The cavities 31 are depressed in the depth direction from a mating surface of the upper mold 30a, while the substrate mounting area 38 is depressed in the depth direction from a mating surface of the lower mold 30b.

A main surface shape (a plane shape) of the substrate mounting area 38 is formed in conformity with the main surface shape of the multiple wiring substrate 20, which is rectangular in this embodiment. The eight cavities 31 are arranged side by side at predetermined intervals in the longitudinal direction of the substrate mounting area 38 so as to be positioned oppositely to the substrate mounting area.

Each cavity 31 has a quadrangular (rectangular in this embodiment) main surface 31a which confronts the main surface 10a of each semiconductor chip 10 at the time of resin sealing and a resin pouring gate 32 is provided in a side face which extends along one of two opposed short sides of the main surface 31a. The cavities 31 are connected through respective resin pouring gates 32 to sub-runners 33 which extend across one long side of the substrate mounting area 38, the sub-runners 33 being connected to a main runner 34 which extends along and outside one long side of the substrate mounting area 38. The main runner 34 is connected to two culls 35. Each resin pouring gate 32 is provided centrally of one short side of the main surface 31a of each cavity 31. That is, the molding die 30 has the center gate structure. On the other short side (the side opposite to the resin pouring gate) of the main surface 31a of the cavity 32 there are formed plural air vents 36.

The resin seal member 14 formed by the molding die 30 is taken out from the die 30. Extra resin which has cured in the culls 35, main runner 34, sub-runners 33 and resin pouring gates 32 is connected to the central part of a side face extending along one short side 14a1 of the main surface 14a of the resin seal member 14 thus taken out from the molding die 30. This extra resin is cut off at the connection between a resin portion cured in the resin pouring gate 32 and the side face of the resin seal member 14. Consequently, as shown in FIG. 1, a gate cut trace 32a formed at the time of cutting off the extra resin remains at the central part of the side face which extends along one short side 14a1 of the main surface 14a of the resin seal member 14.

In the molding die 30, the plural air vents 36 are formed on the other short side of the main surface 31a of the cavity 31. Consequently, though not shown in detail in FIG. 1, plural air vent traces formed in the resin sealing step (resin seal member forming step) remain on the side face extending along the other short side 14a3 of the main surface 14a of the resin seal member 14.

Figure 19:
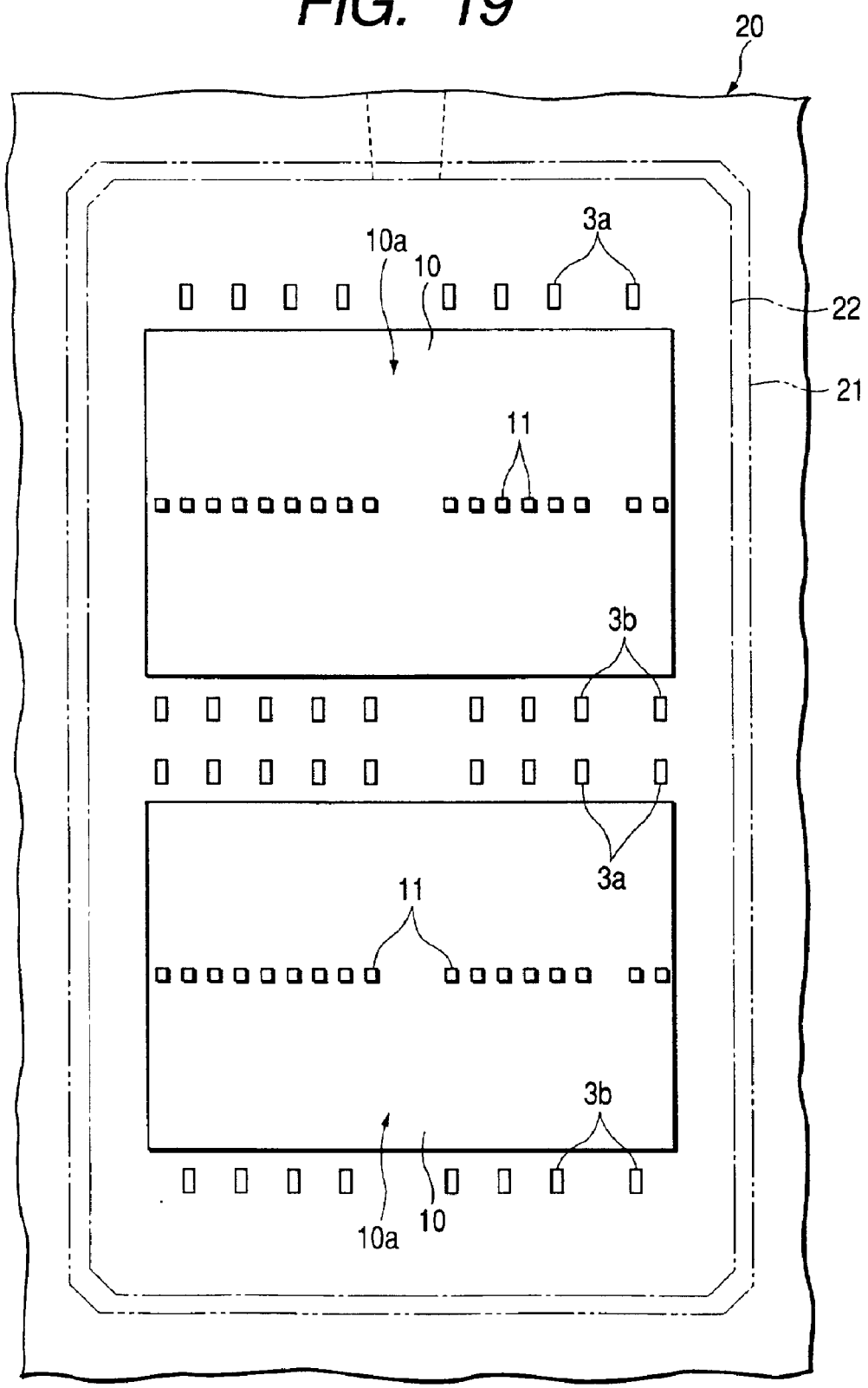
FIG. 19 is a plan view of a principal portion, illustrating a chip mounting step which is carried out in manufacturing the semiconductor device of FIG. 1.

Next, with reference to FIGS. 19 to 28, a description will be given below about the manufacture of the semiconductor device 1A. FIG. 19 is a plan view of a principal portion, illustrating a chip mounting step, FIG. 20 is a plan view of a principal portion, illustrating a wire bonding step, FIG. 21 is a sectional view of a principal portion, illustrating a resin sealing step, FIG. 22 is a plan view of a principal portion, illustrating the resin sealing step, FIGS. 23 to 27 are plan views of a principal portion, illustrating how resin flows in the resin sealing step, and FIG. 28 is a sectional view of a principal portion, illustrating a substrate machining step, all in the manufacture of the semiconductor device.

First, a multiple wiring substrate 20 is provided, then a liquid adhesive, for example, a thermosetting epoxy resin, is applied to the chip mounting area 22 of each substrate forming area 21 on the multiple wiring substrate 20 to form an adhesive layer 12, then a semiconductor chip 10 is mounted onto the chip mounting area 22 through the adhesive layer 12, followed by heat-treatment to let the adhesive layer 12 cure, thereby allowing the semiconductor chip 10 to be bonded and fixed to each chip mounting area 22. In this chip mounting step, since a dam 26 is formed around each air vent hole 25, it is possible to prevent the occurrence of such an inconvenience as the air vent hole 25 being stopped up by the adhesive layer 12.

Figure 20:
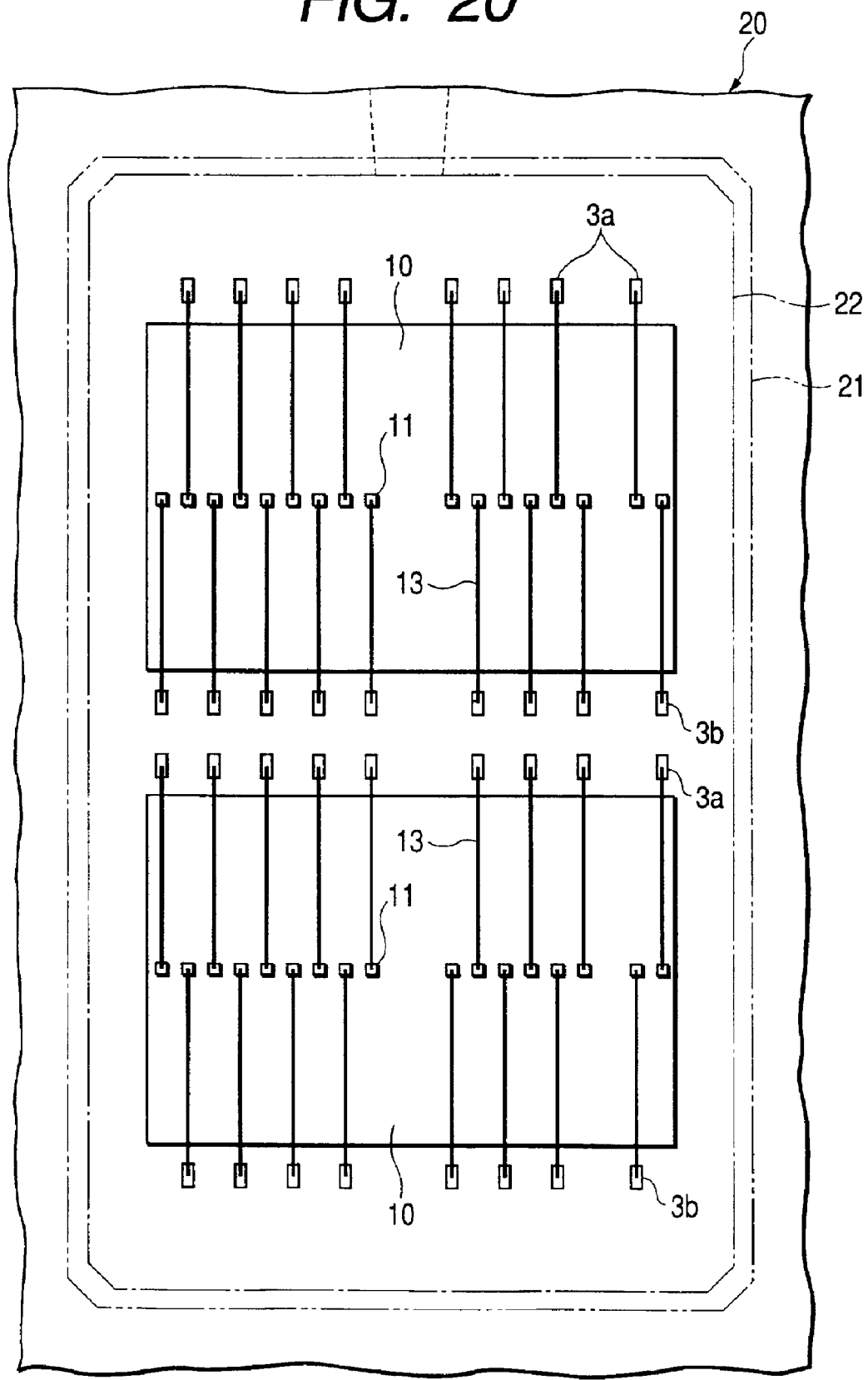
FIG. 20 is a plan view of a principal portion, illustrating a wire bonding step which is carried out in manufacturing the semiconductor device of FIG. 1.

Next, as shown in FIG. 20, plural salient electrodes 11 on the semiconductor chips 10 and plural electrode pads 3a, 3b on the multiple wiring substrate 20 are respectively connected together electrically through bonding wires 13. The connection of the bonding wires 13 is performed by a reverse bonding method wherein the electrode pads 3a, 3b on the multiple wiring substrate 20 and the salient electrodes 11 on the semiconductor chips 10 are used as first and second bonds, respectively. In the area between adjacent semiconductor chips 10 there are arranged, in two rows, electrode pads 3b connected to the salient electrodes 11 of one semiconductor chip 10 and electrode pads 3a connected to the salient electrodes 11 of the other semiconductor chip 10. In the ball bonding method, a movement range of a capillary in a planar direction is smaller in the first bonding than in the second bonding, so by making wire connection in accordance with the reverse bonding method it is made possible to narrow the chip-to-chip distance Y3 (see FIG. 8) in comparison with the ordinary bonding method wherein the salient electrodes 11 on the semiconductor chips 1 are used as the first bond.

Figure 21:
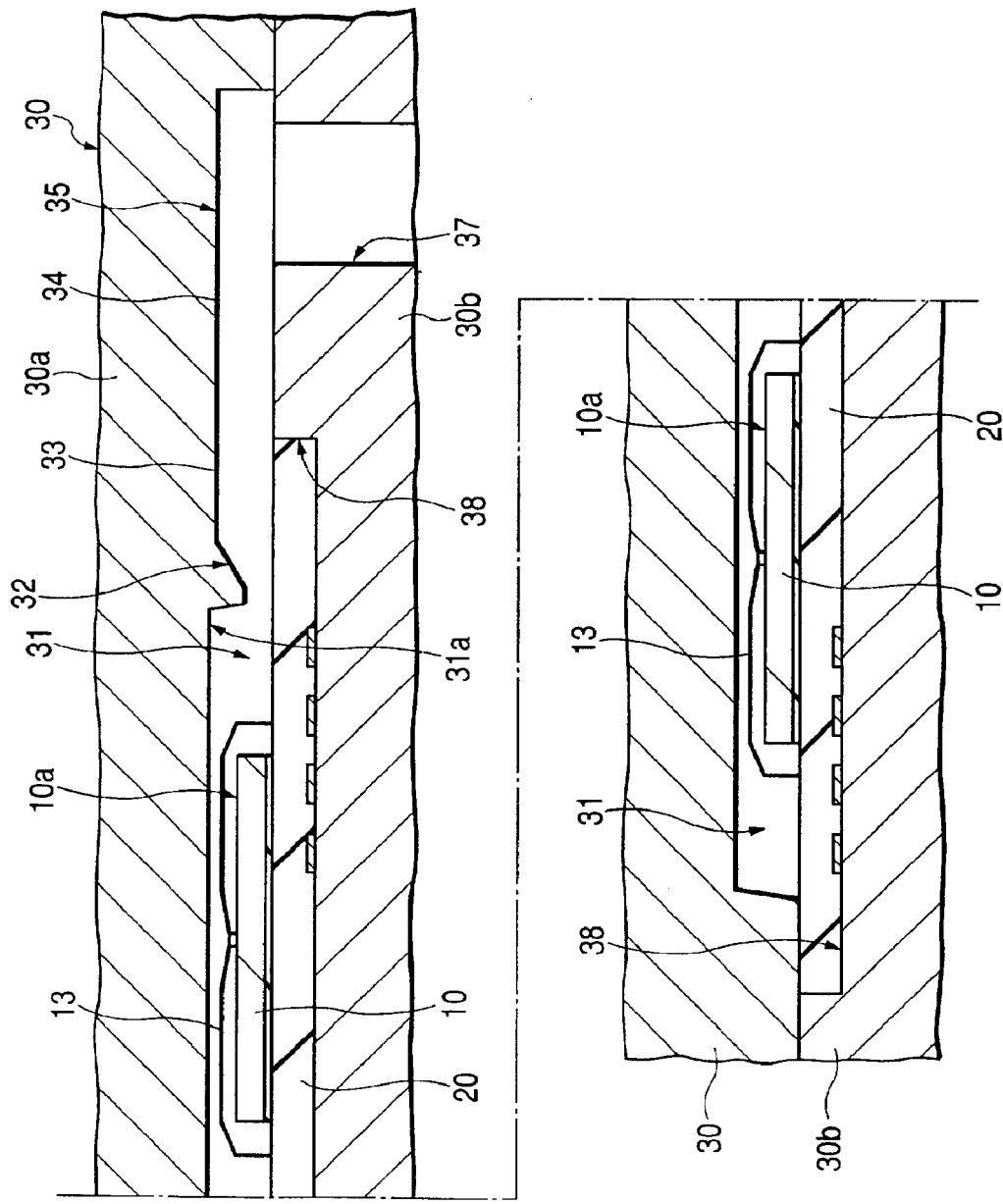
FIG. 21 is a sectional view of a principal portion, illustrating a resin sealing step which is carried out in manufacturing the semiconductor device of FIG. 1.
Figure 22:
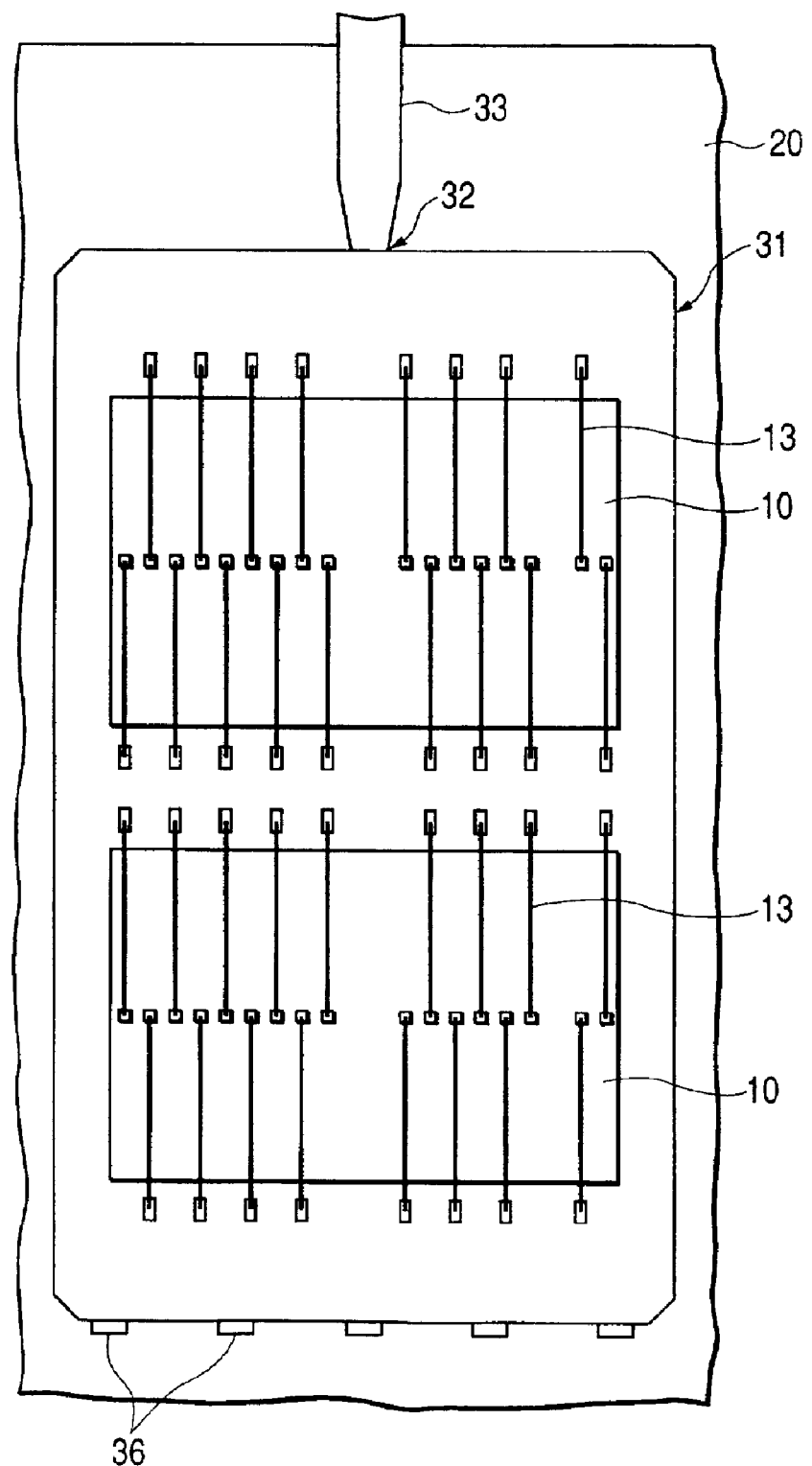
FIG. 22 is a plan view of a principal portion, illustrating the resin sealing step adopted in manufacturing the semiconductor device of FIG. 1.
Figure 23:
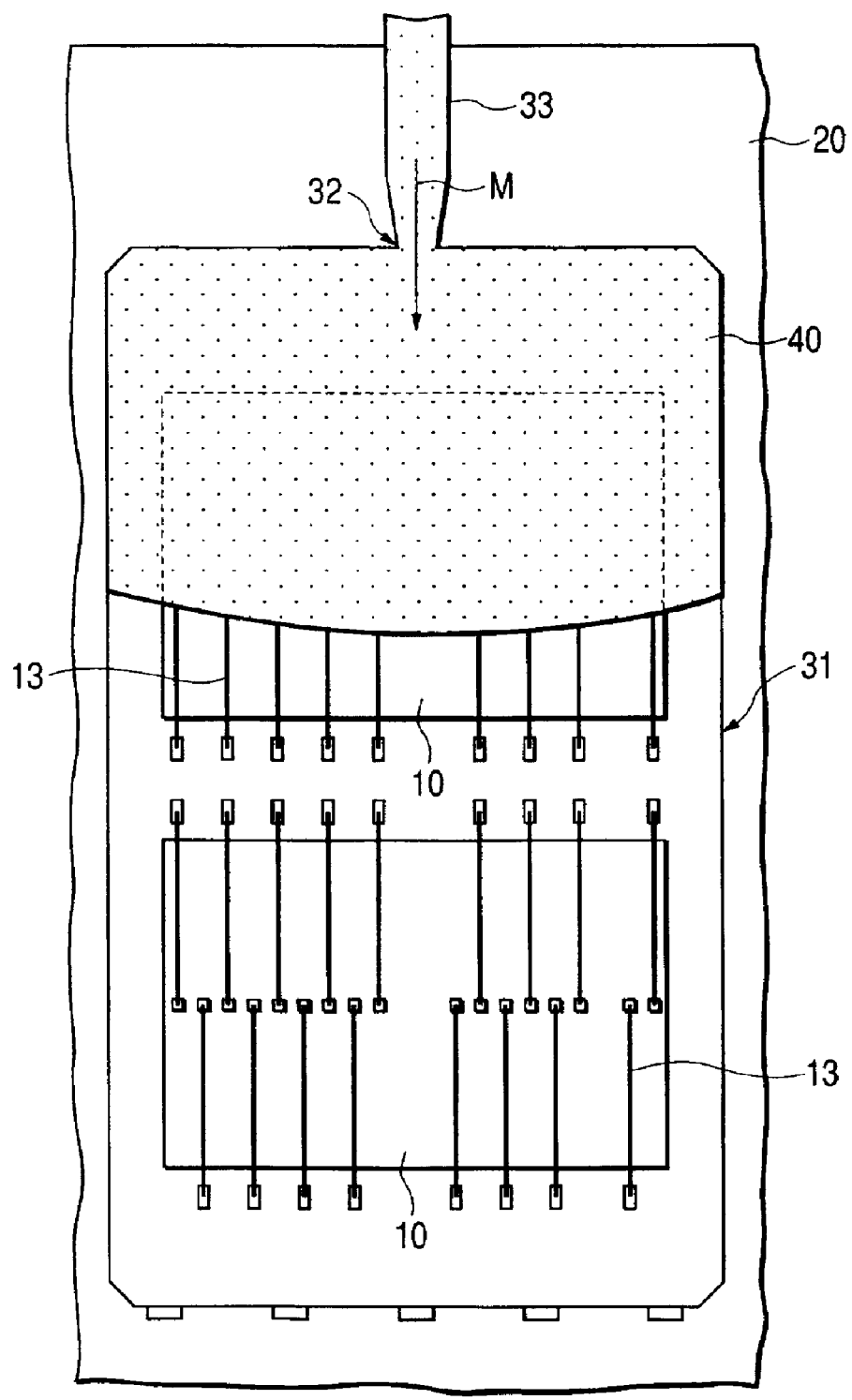
FIG. 23 is a plan view of a principal portion, illustrating how resin flows in the resin sealing step adopted in manufacturing the semiconductor device of FIG. 1.
Figure 24:
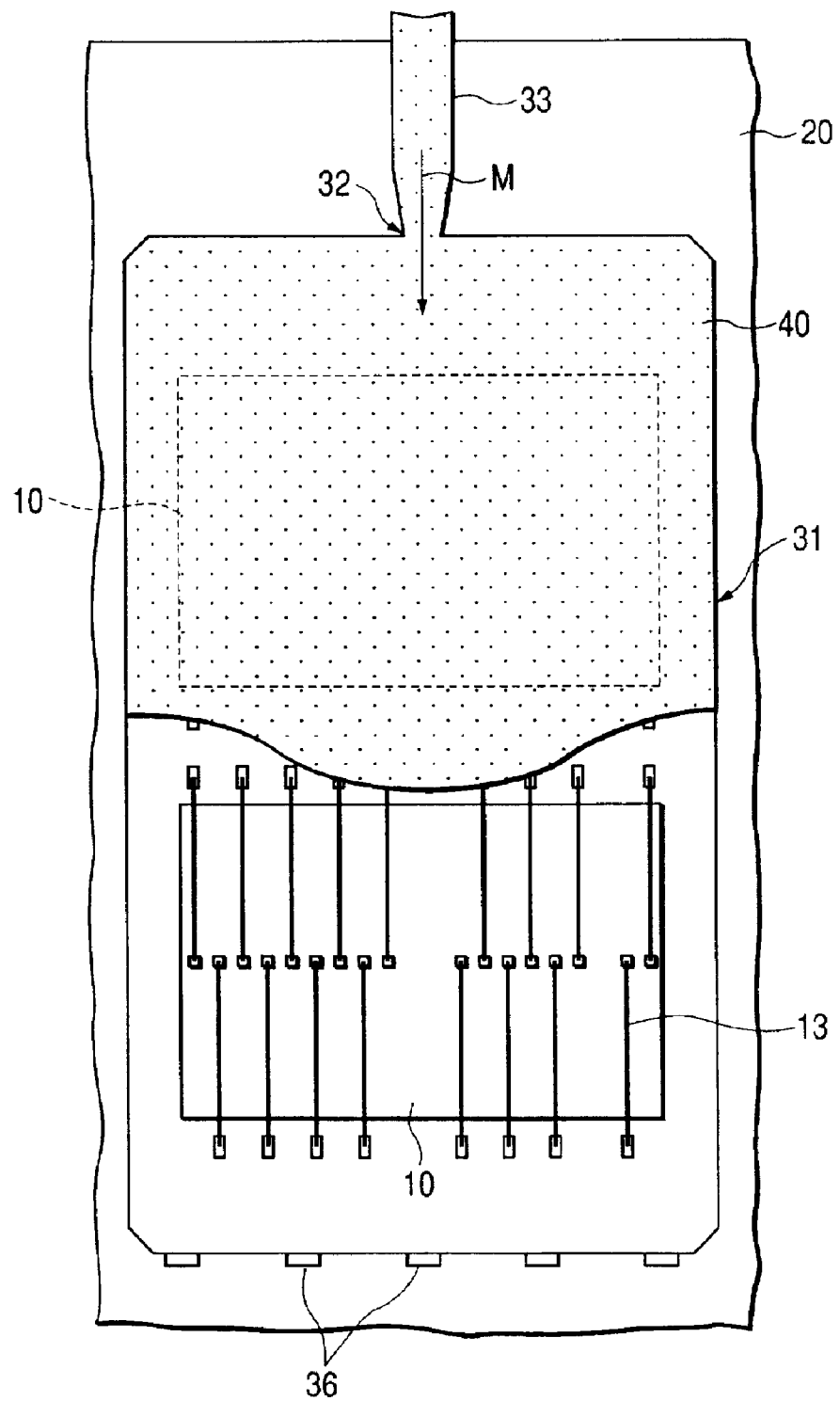
FIG. 24 is a plan view of a principal portion, illustrating how resin flows in the resin sealing step adopted in manufacturing the semiconductor device of FIG. 1.
Figure 25:
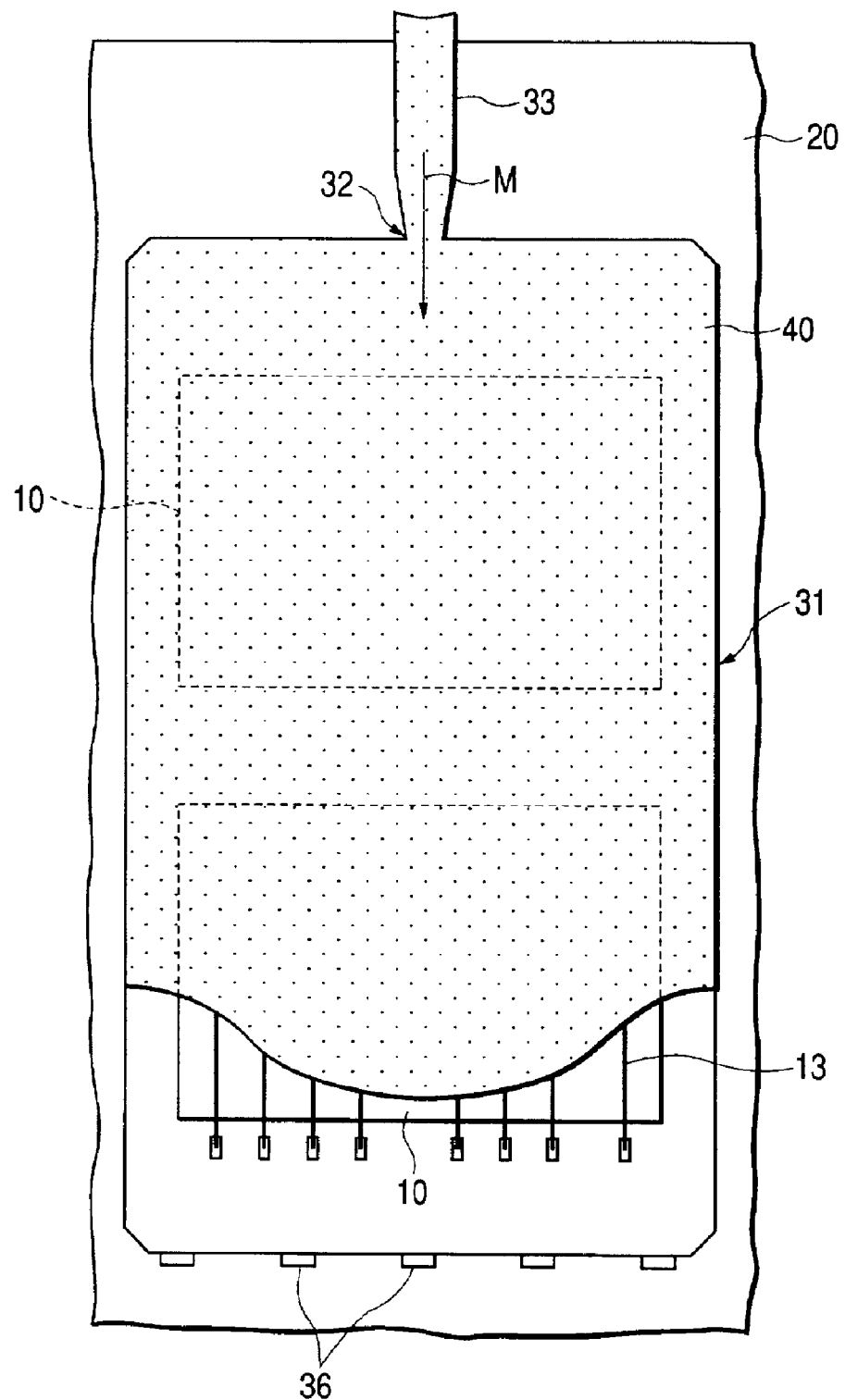
FIG. 25 is a plan view of a principal portion, illustrating how resin flows in the resin sealing step adopted in manufacturing the semiconductor device of FIG. 1.
Figure 26:
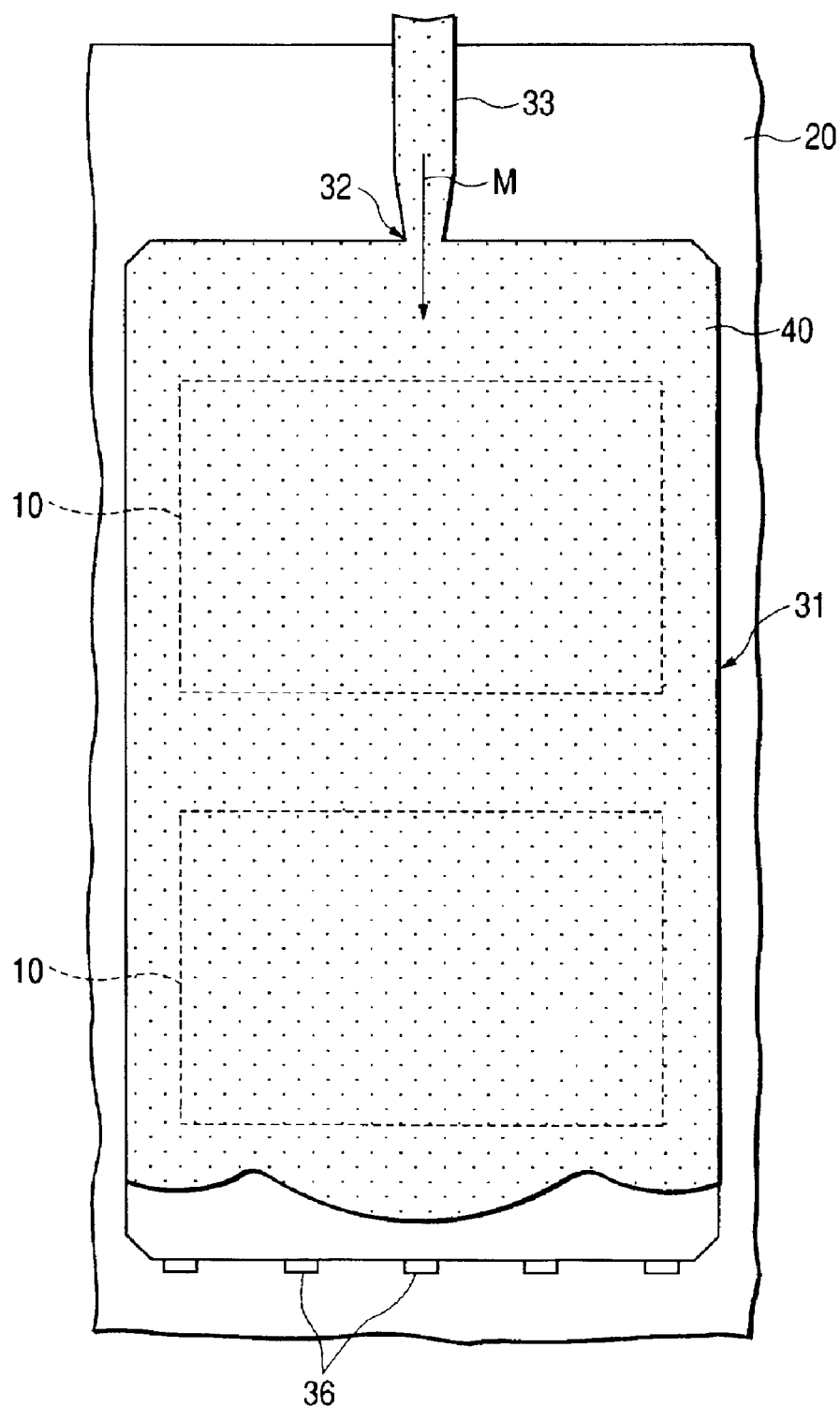
FIG. 26 is a plan view of a principal portion, illustrating how resin flows in the resin sealing step adopted in manufacturing the semiconductor device of FIG. 1.

Next, as shown in FIGS. 21 and 22, the multiple wiring substrate 20 is positioned between the upper and lower molds 30a, 30b of the molding die 30, allowing the semiconductor chips mounted on the multiple wiring substrate 20 to be positioned within the cavities 31 respectively. At this time, the multiple wiring substrate 20 is mounted on the substrate mounting area 38 formed in the lower mold 30b. Further, the main surface 3a of each cavity 31 confronts the main surface 10a of the corresponding semiconductor chip 10.

Next, for example a thermosetting epoxy resin is poured from the pots 37 into the cavities 31 through the culls 35, main runner 34, sub-runners 33 and resin pouring gates 32 to resin-seal the semiconductor chips 10 and bonding wires disposed within each cavity. In this resin sealing step there is formed a resin seal member 14 which seals two semiconductor chips 10, plural bonding wires 13, etc.

Figure 27:
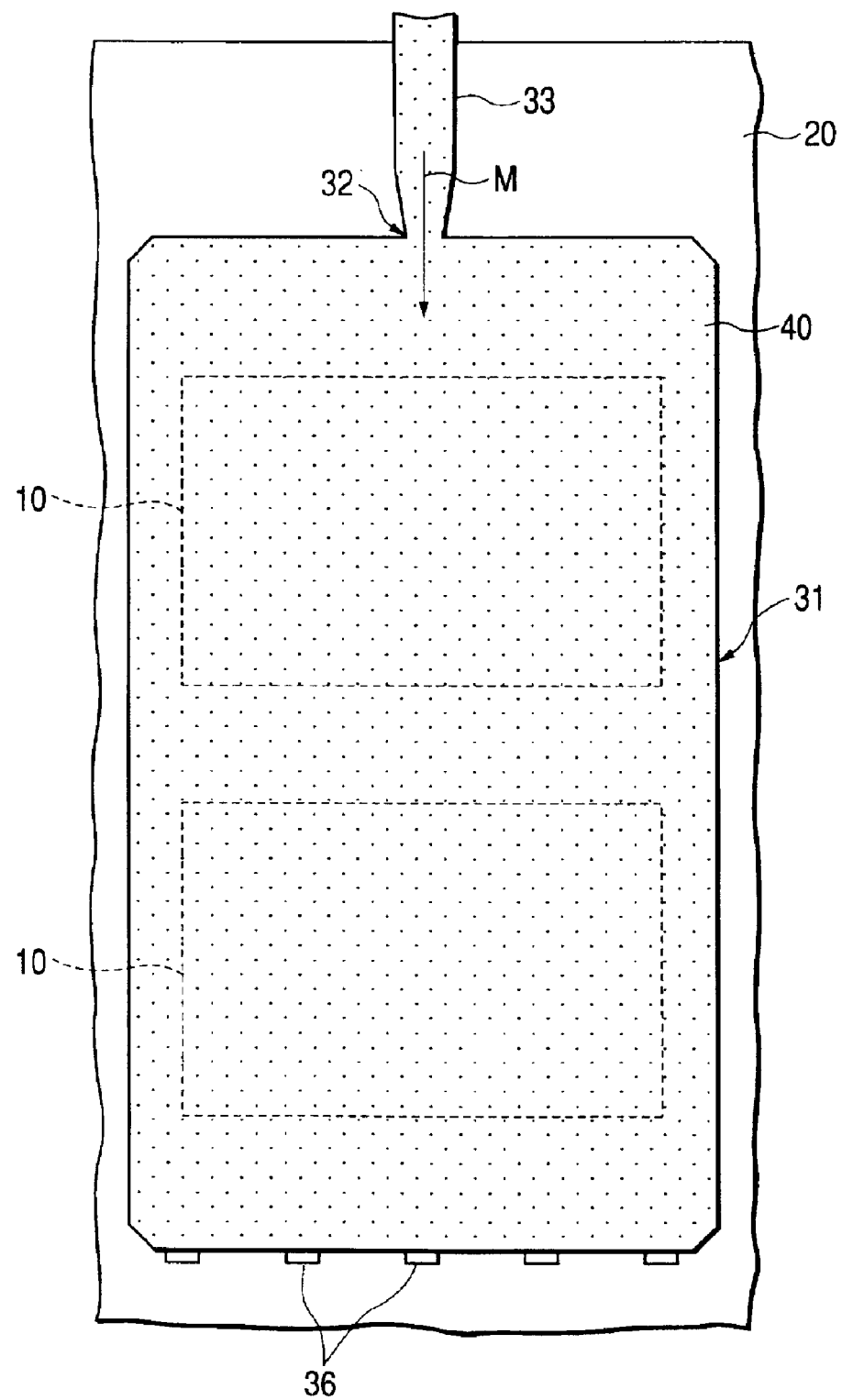
FIG. 27 is a plan view of a principal portion, illustrating how resin flows in the resin sealing step adopted in manufacturing the semiconductor device of FIG. 1.
Figure 28:
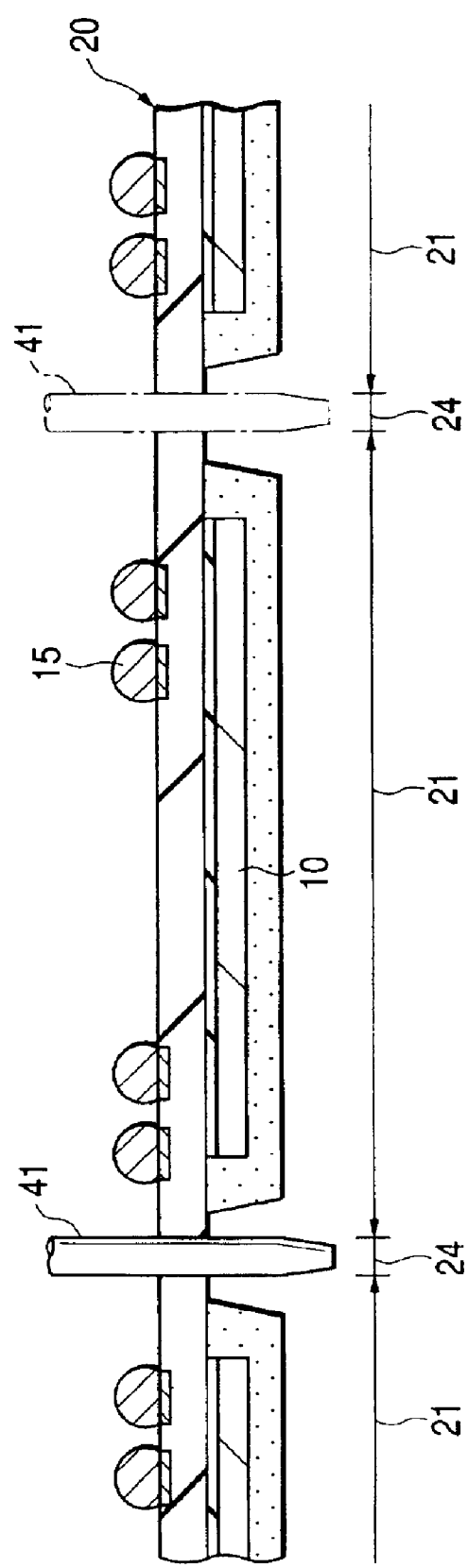
FIG. 28 is a sectional view of a principal portion, illustrating a substrate machining step which is carried out in manufacturing the semiconductor device of FIG. 1.

In this resin sealing step, moreover, the resin, indicated at 40, which has been poured into each cavity 31 flows from one short side toward the other short side of the main surface of the cavity 31, as shown in FIGS. 23 to 26, and is filled into the cavity 31, as shown in FIG. 27.

Voids are formed when the resin 40 flowing on the sides (short sides 10a2 and 10a4) which extend in the resin pouring direction M of the semiconductor chips flows curvedly from both sides to central portions of the sides (the other long sides 10a3 of one and the other semiconductor chips) opposite to the resin pouring gates 32 of the semiconductor chips 10. For suppressing this curved flow of the resin 40 from both sides it is necessary to minimize the difference in flowing velocity between the resin 40 flowing along sides of each semiconductor chip 10 and the resin 40 flowing centrally of the main surface of the chip or let the resin 40 flowing centrally of the chip main surface flow faster than the resin 40 flowing along sides of the chip. The flowing velocity of the resin 40 can be increased by enlarging the sectional area of the resin flowing portion. The main surface 31a and side faces of each cavity 31 correspond to the main surface 14a and side faces of the resin seal member 14, so the definitions of the sectional areas S1 and S2 based on the constructions of the resin seal member 14 and each semiconductor chip 10 are also valid in the interior of each cavity 31. Therefore, if the relation between the sectional areas S1 and S2 explained earlier in connection with FIG. 7 is set at S1>S2, then in comparison with the case of S1<S2 it is possible to decrease the difference in flowing velocity between the resin 40 flowing along sides of each semiconductor chip 10 and the resin 40 flowing centrally of the main surface of the chip or let the flowing velocity of the resin flowing centrally of the main surface of the chip be higher than that of the resin 40 flowing along sides of the chip. Because of s1>S2 in this embodiment, the resin 40 flowing centrally of the main surface 10a of each semiconductor chip 10 is faster than the resin 40 flowing along sides of the chip, so the resin flowing along sides of the chip extending in the resin pouring direction M does not flow curvedly to the central part of the side of the chip located opposite to the resin pouring gate 32. Therefore, as shown in FIG. 27, a void is formed neither between adjacent semiconductor chips 10 nor between the semiconductor chip 10 and the side of the cavity 31 both distant from the resin pouring gate 32.

In this resin sealing step, the resin 40 is poured in the extending direction of the bonding wires 13, so that the resistance which the bonding wires 13 undergo during flowing of the resin 40 becomes small, thus making it possible to suppress wire deformation caused by flowing of the resin and prevent short-circuit between wires. Particularly in the case where the salient electrodes 11 arranged centrally of the main surface 10a of each semiconductor chip 10 along a center line and the electrode pads 3a, 3b arranged around the chip are connected together through the bonding wires 13, as in this embodiment, the bonding wires 13 become long and therefore pouring the resin in the extending direction of the bonding wires makes a great contribution to the above effects.

Next, the multiple wiring board 20 is taken out from the molding die 30. At this time, extra resin which has cured in the culls 35, main runner 34, sub-runners 33 and resin pouring gates 32 is cut off from the resin seal member 14. The cutting is performed at the connection between the resin cured at each resin pouring gate and the corresponding side face of the resin seal member 14. As a result, a gate cut trace 32a remains at the central part of the side face of the resin seal member.

Then, for example by a ball feed method, ball bumps 15 are formed on electrode pads 8 arranged on the back side of the multiple wiring substrate 20. Thereafter, as shown in FIG. 28, the separating area 24 of the multiple wiring substrate 20 is cut with a cutting tool 41 to cut out each substrate forming area 21, thus affording the wiring substrate 2 and the semiconductor device 1A. Although in this embodiment the substrate forming area 21 is cut out after formation of the ball bumps 15, the ball bumps 15 may be formed after cutting out the substrate forming area 21.

The occurrence of void can be suppressed by changing the arrangement of semiconductor chips 10 in the interior of each cavity 31. In FIG. 8, the definitions of the distances (X1, X2, Y1, Y2, Y3) based on the resin seal member 14 and the semiconductor chips 10 are valid also in the interior of the cavity 31. By setting the distance Y3 between the semiconductor chips 10 and the distance Y2 between a side face of one semiconductor chip 10 and the side face opposed thereto of the resin seal member 14 wider than the distances (X1, X2) between side faces of the semiconductor chips 10 and the side faces opposed thereto of the resin seal member 14, it is possible to decrease the speed at which the resin 40 flowing along side faces of the semiconductor chips 10 flows curvedly to the central portions of the side faces of the chips located opposite to the resin pouring gate 32, so that the formation of void can be prevented. Further, by adopting both measures as in this embodiment it is possible to further ensure the prevention of void formation.

Void is apt to occur in the shade of the semiconductor chip 10 distant from the resin pouring gate 32, for example in the portion of Y2 in FIG. 8. This is because the influence of a partial difference in the resin flowing velocity becomes more marked in the longer resin pouring process. Therefore, by setting Y3<Y2 it is possible to prevent the formation of void at the portion of Y2 where void is most likely to occur.

For setting Y3<Y2 for the above purpose and on the premise of reducing the size of the entire package it is necessary to narrow the area between the chips where two rows of electrode pads 3a, 3b are present. In this case, by adopting the reverse bonding method it is possible to narrow the spacing between two rows of electrode pads 3a, 3b which are bonded in directions opposite to each other, thereby making it possible to attain the Y3<Y2 structure more easily without increasing the size of the semiconductor device 1A.

Further, by setting Y3<Y1 ($\approx$Y2) on the premise of the above Y3<Y2 structure it is possible to keep a warp shape of the semiconductor device 1 or weight distribution in a satisfactory condition and hence possible to prevent contact imperfection in a mounting step caused by reflow of the ball bumps 15 and prevent cracking of the semiconductor device 1A and ball bumps 15 in temperature cycling.

Thus, the following effects are attained by this embodiment.

(1) By setting the relation of sectional areas S1 and S2 at S1>S2 it is possible, in comparison with S1<S2, to decrease the difference in flowing velocity between the resin flowing along side faces of each semiconductor chip and the resin flowing centrally of the main surface of the chip or make the flow of the resin flowing centrally of the chip main surface faster than that of the resin flowing along side faces of the chip, so that it is possible to suppress a curved flow of resin from the side faces of each semiconductor chip 10 extending in the resin pouring direction toward the central part of the chip side face located opposite to the resin pouring gate 32. As a result, it is possible to prevent the formation of void.

Moreover, since the formation of void can be suppressed, it is possible to improve the manufacturing yield of the semiconductor device.

Further, since the semiconductor device 1A can be manufactured using a molding die of the center gate structure, it is possible to reduce the cost of the semiconductor device and improve the manufacturing yield thereof.

(2) By setting the relation between the distances X1, X2 and the distance Y3 at X1, X2<Y3 it is possible to decrease the speed at which the resin flowing along side faces of each semiconductor chip 10 flows curvedly toward the central part of the chip side face opposite to the resin pouring gate 32, thus making it possible to suppress the occurrence of void.

(3) By setting the relation between the distances X1, X2 and the distance Y2 at X1, X2<Y2 it is possible to decrease the speed at which the resin flowing along side faces of each semiconductor chip flows curvedly toward the central part of the chip side face opposite to the resin pouring gate 32, thus permitting the occurrence of void to be suppressed.

(4) By pouring the resin 40 in the extending direction of the bonding wires 13, the resistance which the bonding wires undergo during flowing of the resin becomes small, so that wire deformation caused by resin flow can be suppressed and hence it is possible to prevent short-circuit between wires. As a result, it is possible to improve the manufacturing yield of the semiconductor device.

(5) Connection of the bonding wires 13 is performed by the reverse bonding method using the electrode pads 3a, 3b on the multiple wiring substrate 20 as the first bond and the salient electrodes 11 on each semiconductor chip 10 as the second bond. Consequently, the chip-to-chip distance Y3 (see FIG. 8) can be narrowed in comparison with the ordinary bonding method using the salient electrodes 11 on the chip as the first bond.

Although in this embodiment two semiconductor chips 10 are arranged in the short side direction of the resin seal member 14, the present invention is also applicable to the case where plural semiconductor chips 10 are arranged in the long side direction of the resin seal member 14. In this case, short sides of the main surface of the resin seal member extend along the short sides of the main surface of the semiconductor chip, while long sides of the main surface of the resin seal member extend along the long sides of the chip main surface. In such a construction, if a resin pouring gate is provided in a side face extending along one short side of the main surface of the cavity, a longer resin pouring process results, so that the occurrence of void becomes more marked. In such a case, the application of the present invention is effective.

Although in this embodiment two semiconductor chips 10 are sealed with one resin seal member 14, the present invention is also applicable to the case where one semiconductor chip 10 is sealed with one resin seal member 14.

(Second Embodiment)

Figure 29:
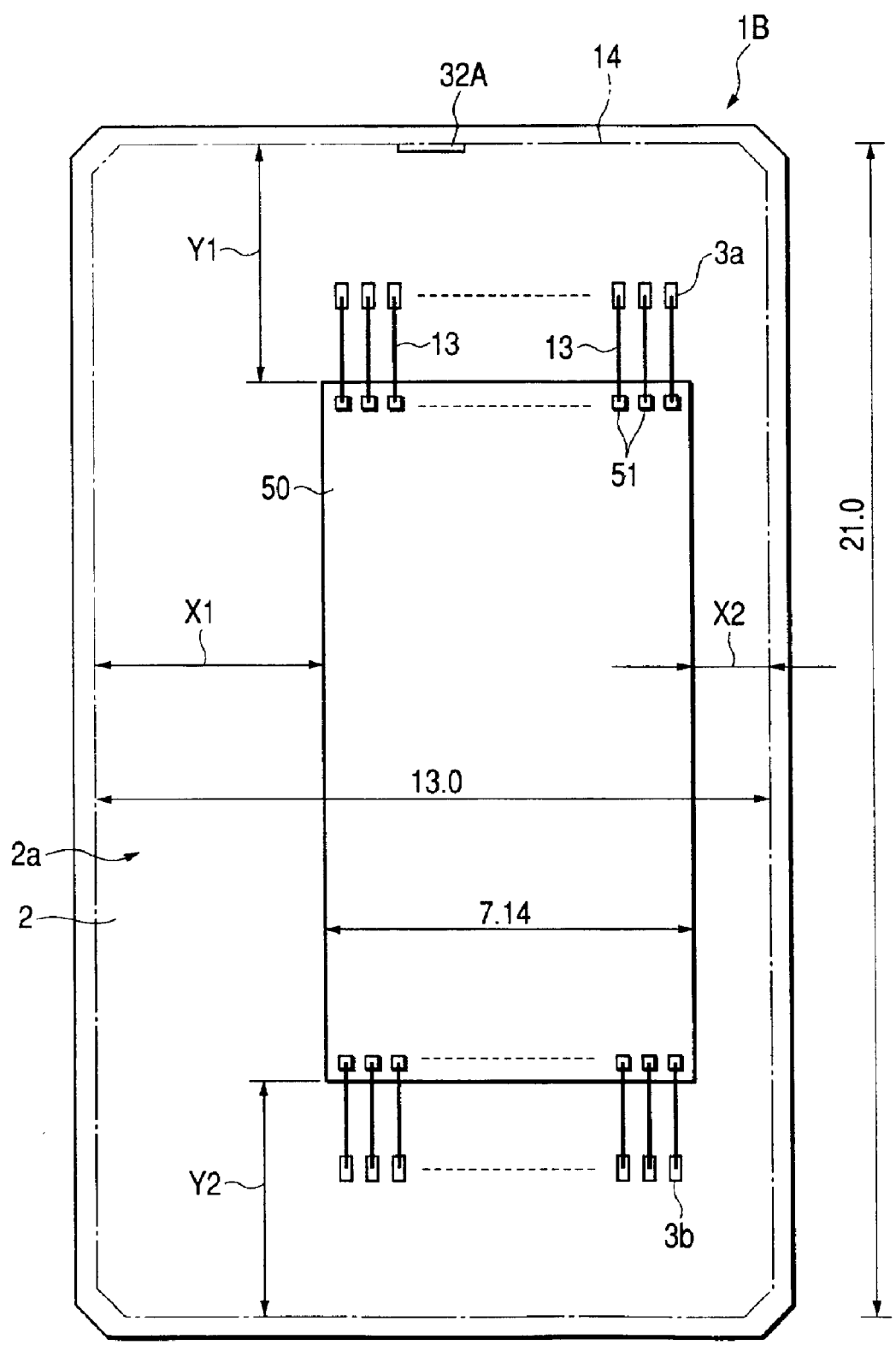
FIG. 29 is a plan view of a semiconductor device according to a second embodiment of the present invention, with a resin seal member removed.
Figure 30:
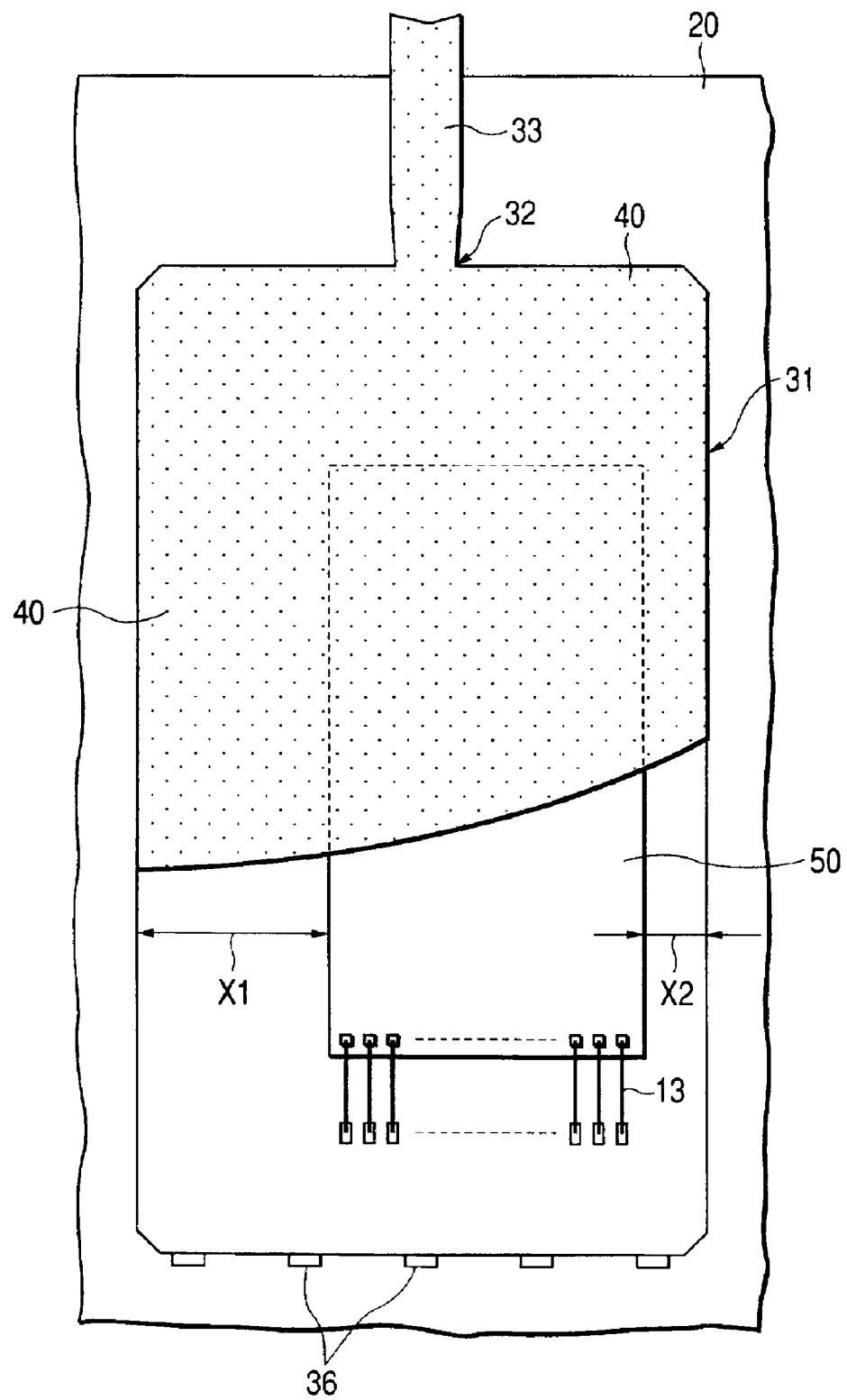
FIG. 30 is a plan view of a principal portion, illustrating how resin flows in a resin sealing step which is carried out in manufacturing the semiconductor device of FIG. 29.
Figure 31:
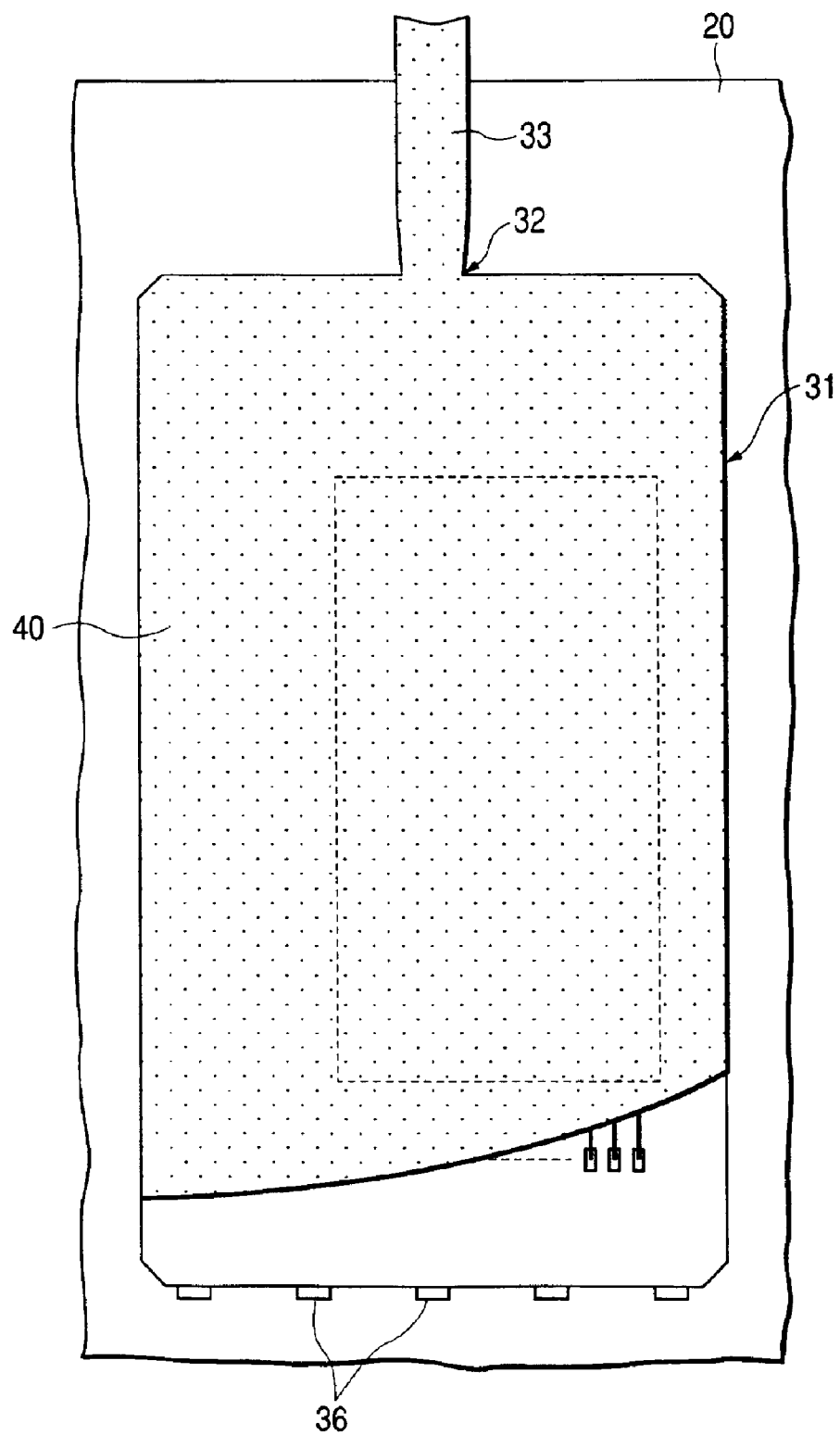
FIG. 31 is a plan view of a principal portion, illustrating how resin flows in the resin sealing step adopted in manufacturing the semiconductor device of FIG. 29.
Figure 32:
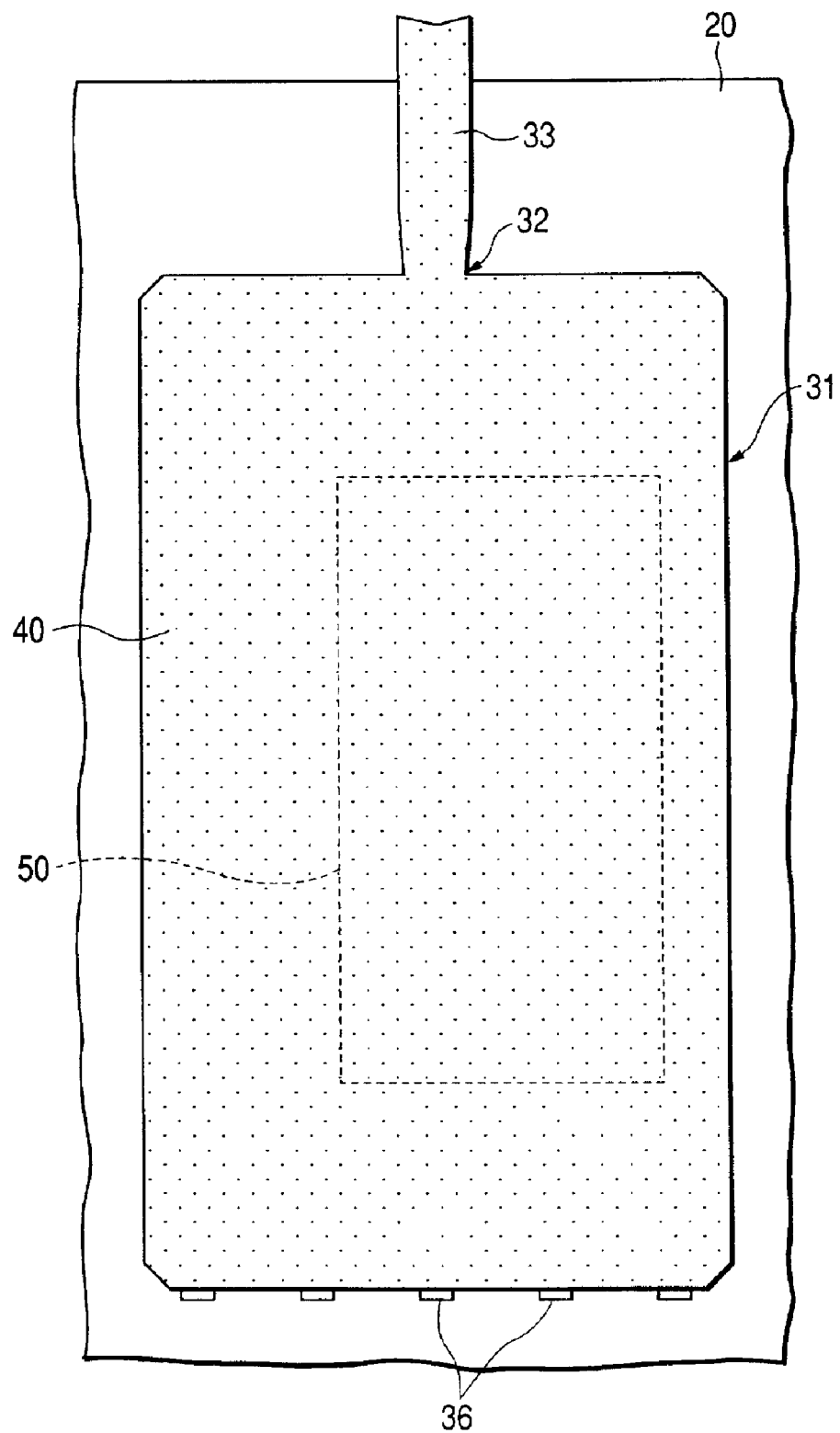
FIG. 32 is a plan view of a principal portion, illustrating how resin flows in the resin sealing step adopted in manufacturing the semiconductor device of FIG. 29.

FIG. 29 is a plan view of a semiconductor device according to a second embodiment of the present invention with a resin seal member removed and FIGS. 30 to 32 are plan views of a principal portion, illustrating how resin flows in a resin sealing step which is used in manufacturing the semiconductor device of FIG. 29.

In the semiconductor device, indicated at 1B, of this embodiment, the distance X1 between a side face extending along one long side of a main surface of a semiconductor chip and a side face extending along one long side of a main surface of a resin seal member 14 is wider than the distance X2 between a side face extending along the other long side of the main surface of the chip 50 and a side face extending along the other long side of the resin seal member 14. In this embodiment, the distance X1 is, for example, 4.4 mm or so and the distance X2 is, for example, 1.46 mm or so. A main surface shape of the semiconductor chip 50 is a rectangular shape of, for example, 7.14 mm×14.0 mm or so. The distance Y1 from a side face extending along one short side of the main surface of the semiconductor chip 50 to a side face extending along one short side of the main surface of the resin seal member 14 and the distance Y2 from a side face extending along the other short side of the main surface of the semiconductor chip 50 to a side face extending along the other short side of the main surface of the resin seal member 14 are, for example, 3.5 mm or so.

Plural electrode pads 51 serving as connections are formed on the main surface of the semiconductor chip 50 so as to be arranged on and along the two short sides of the chip main surface.

One and the other short sides of the main surface of the resin seal member 14 extend along one and the other short sides of the main surface of the semiconductor chip 50, while one and the other long sides of the main surface of the resin seal member 14 extend along one and the other long sides of the chip main surface. A gate cut trace 32a is provided at a central part of the side face extending along one short side of the main surface of the resin seal member 14. The gate cut trace 32a confronts one short side of the main surface of the semiconductor chip 50.

Description is now directed to the manufacture of the semiconductor device 1B with reference to FIGS. 30 to 32. FIGS. 30 to 32 are plan views of a principal portion, illustrating how resin flows in a resin sealing step which is adopted in manufacturing the semiconductor device 1B.

Resin 40 which has been poured into a cavity 31 flows from one short side of a main surface of the cavity toward the other short side thereof, as shown in FIGS. 30 and 31, and is filled into the cavity 31. At this time, since the distances X1 and X2 are in a relation of X1>X2, the flowing velocity of the resin 40 present on one long side of the main surface of the semiconductor chip 50 is high, so that the resin 40 flows in an inclined state of its head portion relative to the short side opposite to the resin pouring gate. This resin flow is similar to that in a molding die of the side gate structure.

By thus setting the distances X1 and X2 at X1>X2, the resin flows in an inclined state of the resin head relative to the short side opposite to the resin pouring gate, so that there is not formed such a flow as involves air therein. Thus, it is possible to prevent the occurrence of void.

(Third Embodiment)

Figure 33:
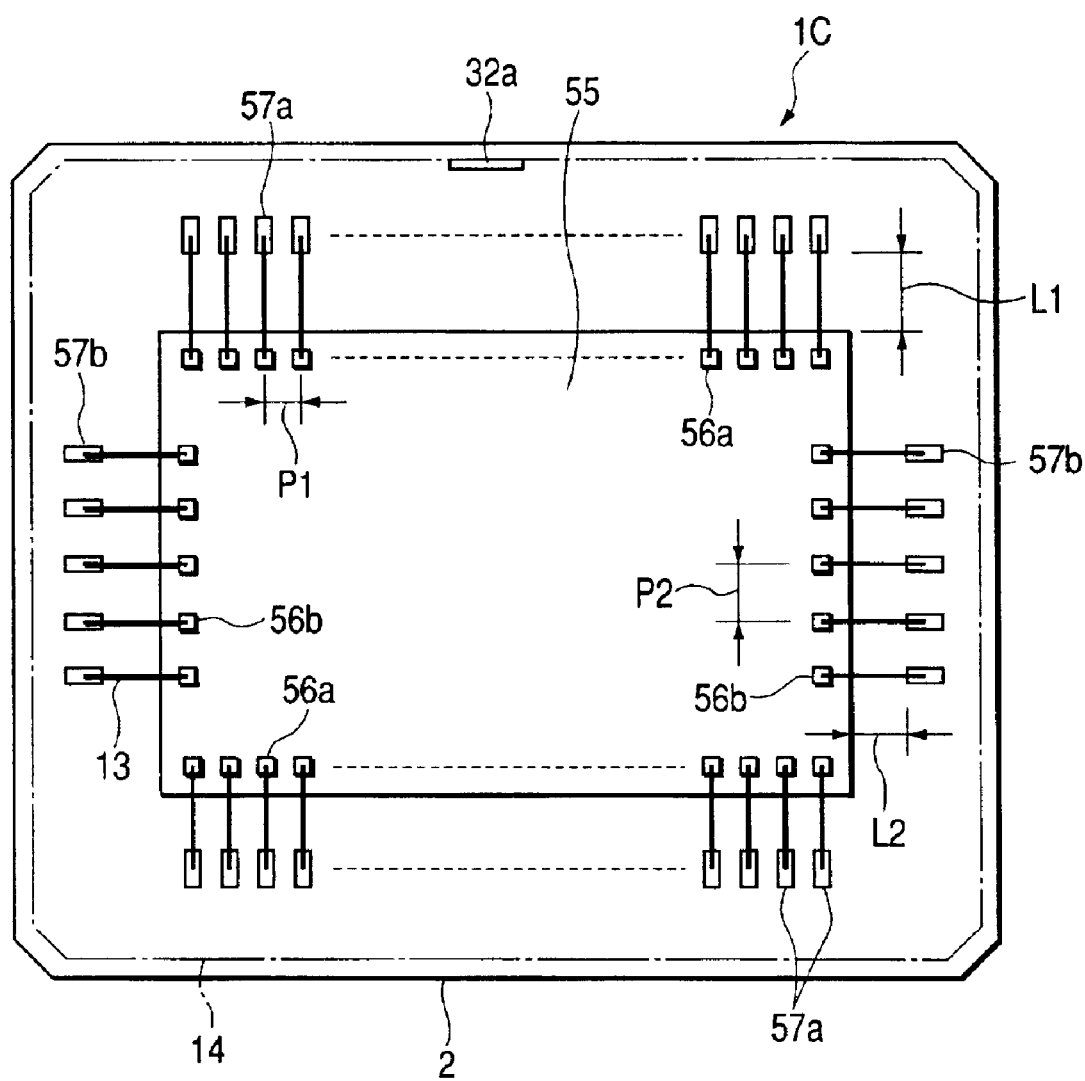
FIG. 33 is a plan view of a semiconductor device according to a third embodiment of the present invention, with a resin seal member removed.
Figure 34:
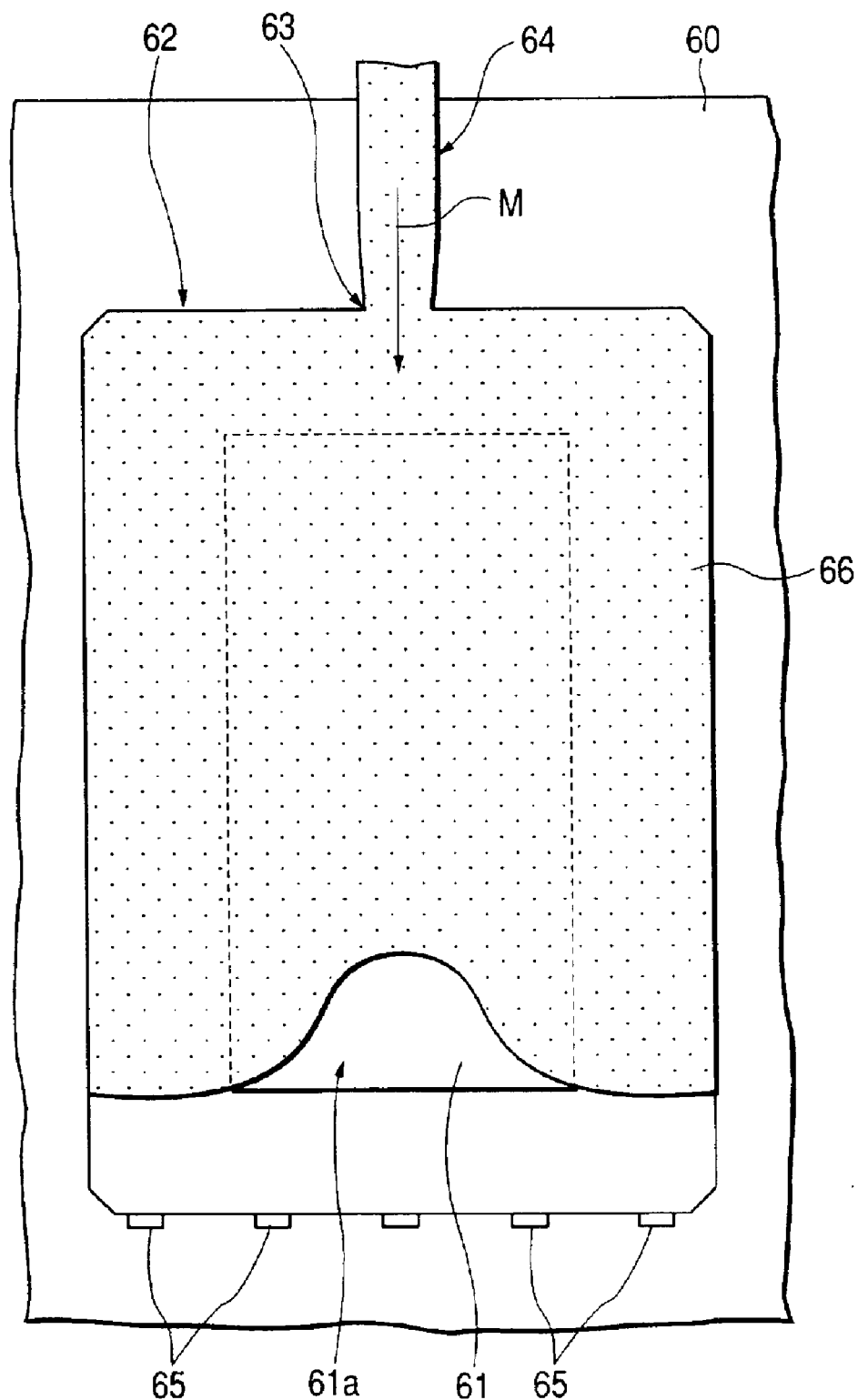
FIG. 34 is a plan view of a principal portion, illustrating how resin flows in a resin sealing step which is carried out in manufacturing a conventional semiconductor device.
Figure 35:
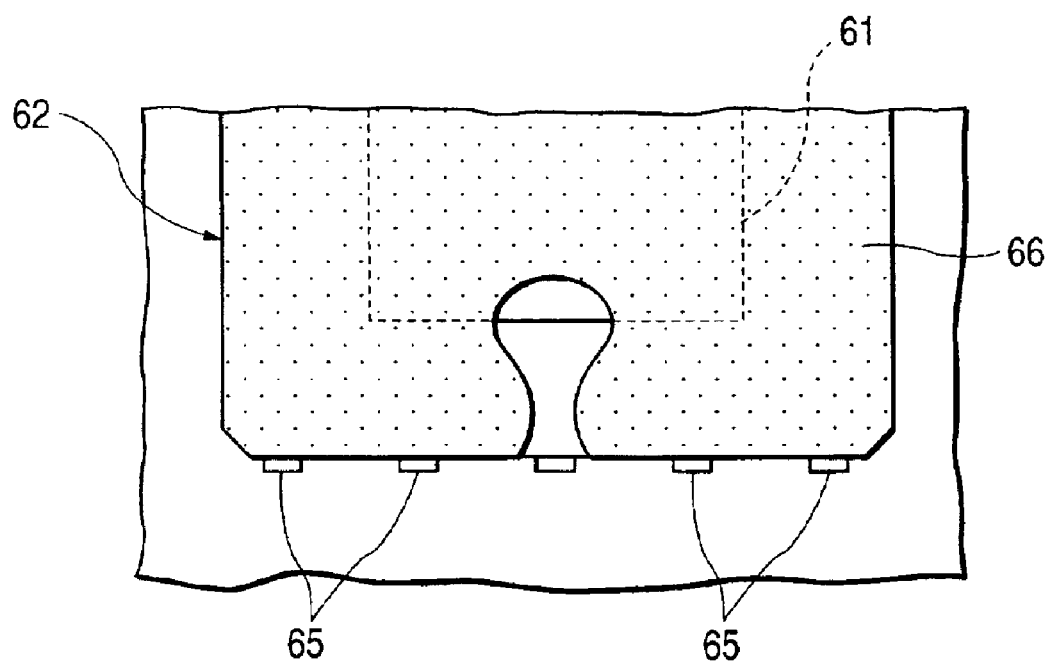
FIG. 35 is a plan view of a principal portion, illustrating how resin flows in the resin sealing step adopted in manufacturing the conventional semiconductor device.
Figure 36:
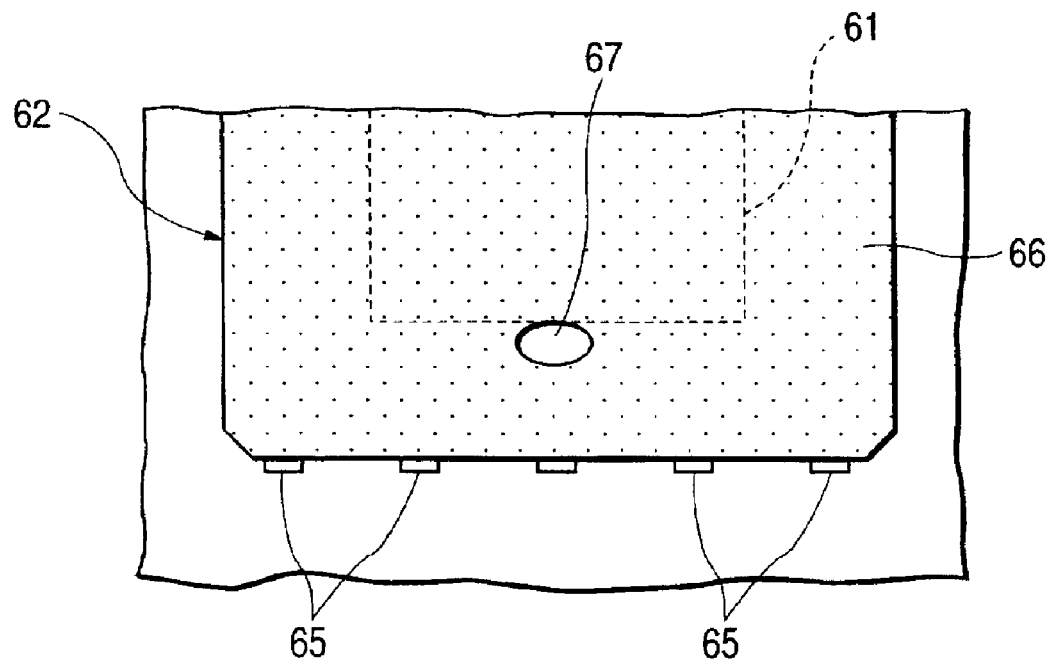
FIG. 36 is a plan view of a principal portion, illustrating how resin flows in the resin sealing step adopted in manufacturing the conventional semiconductor device.

FIG. 33 is a plan view of a semiconductor device according to a third embodiment of the present invention, with a resin seal member removed.

As shown in FIG. 33, the semiconductor device, indicated at 1C, of this embodiment comprises a wiring substrate 2, plural electrode pads 57a, 57b formed on a main surface of the wiring substrate 2, a semiconductor chip 55 mounted on the main surface of the wiring substrate 2, plural electrode pads 56a, 56b formed on a main surface of the semiconductor chip 55, plural bonding wires 13 for electrical connection between the plural electrode pads 57a, 57b and the plural electrode pads 56a, 56b, a resin seal member 14 for sealing these components, and plural ball bumps formed on the back side of the wiring substrate 2.

The main surface of the semiconductor chip 55 is formed in a rectangular shape, and a gate cut trace 32a is formed on a side face of the resin seal member 14 which confronts one long side of the chip main surface. The plural electrode pads 56a are arranged on and along the two long sides of the main surface of the semiconductor chip 55, while the plural electrode pads 56b are arranged on and along the two short sides of the chip main surface.

The plural electrode pads 57a are arranged along and outside the two long sides of the main surface of the semiconductor chip 55, while the plural electrode pads 57b are arranged along and outside the two short sides of the chip main surface.

An arrangement pitch of the electrode pads 56b arranged along the short sides of the main surface of the semiconductor chip 55 is set wider than an arrangement pitch P1 of the electrode pads 56a arranged along the long sides of the chip main surface. Likewise, an arrangement pitch of the electrode pads 57b arranged along the short sides of the chip main surface is set wider than an arrangement pitch of the electrode pads 57a arranged along the long sides of the chip main surface.

The distance L2 between electrode pads 57b and a side face extending along a short side of the chip main surface which confronts the pads is shorter than the distance L1 between electrode pads 57a and a side face extending along a long side of the chip main surface which confronts the pads. The number of the electrode pads 56b and 57b is smaller than that of the electrode pads 56a and 57a.

The bonding wires 13 which electrically connect the electrode pads 56a on the semiconductor chip 55 and the electrode pads 57a on the wiring substrate 2 with each other extend across the long sides of the main surface of the chip. The bonding wires 13 which electrically connect the electrode pads 56b on the semiconductor chip 55 and the electrode pads 57b on the wiring substrate 2 with each other extend across the short sides of the chip main surface.

In the step of forming the resin seal member 14, the pouring of resin into the cavity is performed in the extending direction of the bonding wires 13 which is for electrical connection between the electrode pads 56a and 57a. Since the pads 56a–57a bonding wires 13 extend in the resin pouring direction, the resistance which the bonding wires undergo during resin flow is small. Consequently, it is possible to suppress the deformation of the pads 56a–57a bonding wires 13 caused by flowing of the resin and hence possible to prevent short-circuit between wires.

On the other hand, the bonding wires 13 for electrical connection between the electrode pads 56b and 57b extend in a direction of nearly 90° in terms of an angle of intersection relative to the resin pouring direction, so that the short-circuit between wires is apt to occur due to the flowing of resin. However, by setting the arrangement pitch P2 of the electrode pads 56b arranged along the short sides of the main surface of the semiconductor chip 55 wider than the arrangement pitch P1 of the electrode pads 55a arranged along the long sides of the chip main surface, the spacing between adjacent bonding wires 13 for electrical connection between the electrode pads 56b and 57b becomes wide, so that also these bonding wires 13 it is possible to prevent wire-to-wire short circuit caused by the flowing of resin.

Moreover, by setting the distance L2 between electrode pads 57b and a side face extending along a short side of the main surface of the semiconductor chip 55 which confronts the pads shorter than the distance L1 between electrode pads 57a and a side face extending along a long side of the chip which confronts the pads, the degree of wire deformation caused by the flowing of resin decreases, so that also in the electrode pads 56b–57b bonding wires 13 it is possible to prevent wire-to-wire short circuit caused by the flowing of resin.

Further, by making the number of electrode pads 56b and 57b smaller than that of the electrode pads 56a and 56b, the number of bonding wires 13 which are apt to be deformed during the pouring of resin decreases, so that it is possible to lower the percent occurrence of wire-to-wire short-circuit.

By thus preventing wire-to-wire short-circuit and lowering the percent occurrence thereof it is possible to improve the manufacturing yield of the semiconductor device.

Although the present invention has been described concretely by way of the above embodiments, it goes without saying that the present invention is not limited to those embodiments and that various modifications may be made within the scope not departing from the gist of the invention.

The following is a brief description of typical effects attained by the present invention.

The occurrence of void can be suppressed.

The semiconductor manufacturing yield can be improved.

Further, it is possible to attain both reduction in cost and improvement in manufacturing yield of the semiconductor device.

What is claimed is:

1. A method of manufacturing a semiconductor device, comprising the steps of:

providing a semiconductor chip having a quadrangular main surface, a wiring substrate with the semiconductor chip disposed on a main surface thereof, and a molding die having a cavity and a resin pouring gate, the cavity having a quadrangular main surface which confronts the main surface of the semiconductor chip, the resin pouring gate being formed in a side face extending along a first side of the main surface of the cavity; and positioning the wiring substrate in the molding die in such a manner that the main surface of the semiconductor chip and the main surface of the cavity confront each other and that a first side of the main surface of the semiconductor chip confronts the first side of the main surface of the cavity, and thereafter pouring resin into the cavity through the resin pouring gate to form a resin seal member which seals the semiconductor chip with the resin, wherein the resin sealing step for the semiconductor chip is carried out in a state in which, in a section orthogonal to a second side of the main surface of the semiconductor chip which intersects the first side of the main surface of the semiconductor chip, a sectional area of an area between the main surface of the wiring substrate and the main surface of the cavity at a position outside a side face along the extending direction of the second side of the main surface of the semiconductor chip is smaller than a sectional area of an area between the main surface of the semiconductor chip and the main surface of the cavity.

2. A method according to claim 1, wherein the resin pouring gate is opposed to the first side of the main surface of the semiconductor chip.

3. A method according to claim 1, wherein the resin pouring gate is opposed to a central part of a first side of a main surface of the resin seal member.

* * * * *